United States Patent
Li

(10) Patent No.: US 9,024,292 B2
(45) Date of Patent: May 5, 2015

(54) MONOLITHIC SEMICONDUCTOR LIGHT EMITTING DEVICES AND METHODS OF MAKING THE SAME

(71) Applicant: Xiaohang Li, Guangxi (CN)

(72) Inventor: Xiaohang Li, Guangxi (CN)

(*) Notice: Subject to any disclaimer, the term of this patent is extended or adjusted under 35 U.S.C. 154(b) by 14 days.

(21) Appl. No.: 13/907,469

(22) Filed: May 31, 2013

(65) Prior Publication Data

US 2013/0320299 A1    Dec. 5, 2013

Related U.S. Application Data

(60) Provisional application No. 61/654,843, filed on Jun. 2, 2012.

(51) Int. Cl.
| | |
|---|---|
| H01L 29/06 | (2006.01) |
| H01L 31/00 | (2006.01) |
| H01L 33/08 | (2010.01) |
| H01L 33/06 | (2010.01) |
| H01L 33/32 | (2010.01) |
| H01L 33/00 | (2010.01) |
| H01L 33/18 | (2010.01) |
| H01L 33/24 | (2010.01) |

(52) U.S. Cl.
CPC .............. *H01L 33/08* (2013.01); *H01L 33/007* (2013.01); *H01L 33/06* (2013.01); *H01L 33/18* (2013.01); *H01L 33/24* (2013.01); *H01L 33/32* (2013.01)

(58) Field of Classification Search
USPC ............ 257/13, 81, 82, 91, 98, 99, 100, 116, 257/117, 432–437, 749, E33.056–E33.059, 257/E25.032; 438/3, 785, E21.208
See application file for complete search history.

(56) References Cited

U.S. PATENT DOCUMENTS

| | | | |
|---|---|---|---|
| 7,323,721 B2 | 1/2008 | Chen et al. | |
| 8,022,388 B2 | 9/2011 | Brandes | |
| 8,035,117 B2 * | 10/2011 | DenBaars et al. | 257/89 |
| 2004/0056258 A1 * | 3/2004 | Tadatomo et al. | 257/79 |
| 2004/0161005 A1 * | 8/2004 | Bour et al. | 372/45 |
| 2013/0099141 A1 * | 4/2013 | Chua | 250/504 R |
| 2013/0215921 A1 * | 8/2013 | Cohen et al. | 372/45.01 |

* cited by examiner

*Primary Examiner* — Dao H Nguyen
*Assistant Examiner* — Tram H Nguyen
(74) *Attorney, Agent, or Firm* — Morris, Manning & Martin, LLP; Christopher W. Raimund

(57) ABSTRACT

A monolithic semiconductor light emitting device is described. The device includes an n-type region, a p-type region, an active region of a multiple quantum well structure comprising a plurality of alternating barrier and active layers interposed between the n-type region and the p-type region. The device emits multiple single-wavelength spectral distributions of ultraviolet light each having a peak wavelength of between 210 nm and 400 nm and/or a broadband spectral output having a wavelength of between 210 nm and 400 nm. Methods of making the device and lamps comprising the device are also described.

18 Claims, 12 Drawing Sheets

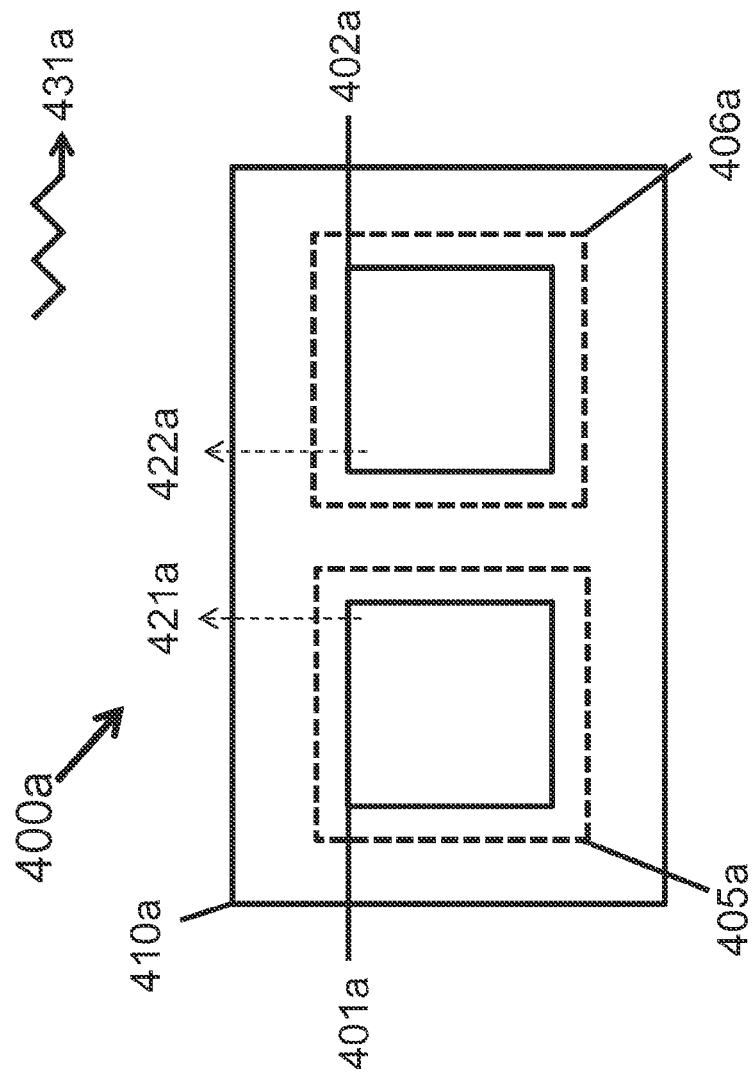

MONOLITHIC SEMICONDUCTOR LIGHT EMITTING DEVICES AND METHODS OF MAKING THE SAME

CROSS REFERENCE TO RELATED CASES

This application claims the benefit of Provisional U.S. Application Ser. No. 61/654,843, filed Jun. 2, 2012, which is incorporated by reference herein in its entirety.

BACKGROUND

1. Technical Field

The present invention is in the technical field of semiconductor ultraviolet light-emitting devices and lamps. More particularly, the present invention comprises semiconductor ultraviolet light-emitting devices which can emit multiple-wavelength and/or broadband spectral output in the ultraviolet spectrum and lamps based on these devices.

2. Background of the Technology

It is well known that ultraviolet (UV) light with wavelength for 210 nm to 400 nm may be used for disinfecting fluid and air. The UV light may inactivate the pathogens such as bacteria (E. coli), viruses (poliovirus, influenza, hepatitis), protozoan cysts (cryptosporidium, Giardia Lamblia), yeasts and molds by breaking the molecular bonds within micro-organismal DNA, producing thymine dimers in their DNA thereby destroying them, rendering them harmless or prohibiting growth and reproduction.

Currently, mercury-vapor lamps are the most common UV light sources and are classified into low-, medium- and high-pressure bulbs. For long, most of the fluid and air purification community have employed low-pressure UV bulb that generates a single wavelength spectral distribution with the peak wavelength of 254 nm. This is partly due to the fact that the costs of ownership of medium- and high-pressure UV bulbs are much higher than the low-pressure UV bulbs. Another reason responsible for the high popularity of low-pressure UV bulb is based on the assumption that the DNA absorption peak wavelength is around 260 nm, which is very close to the spectrum of the low-pressure UV bulb around 254 nm.

In comparison to the single-wavelength spectral distribution of low-pressure mercury bulbs, the medium- and high-pressure bulbs have about a ten-wavelength spectral distribution in the UV spectrum. However, the spectral energies of medium- and high-pressure mercury bulbs do not overlap the DNA absorption peak wavelength as much as low-pressure bulbs do. Therefore the pathogen inactivation efficiencies of the medium-and high-pressure bulbs were widely thought to be lower than the low-pressure UV bulbs.

However, the true mechanism of the interaction between the pathogens and radiating wavelengths might actually be complex: the pathogen inactivation may further depend on the reaction between proteins, amino acid, different structures and UV light with spectral distributions. In some recent studies, the multiple-wavelength spectral distributions from the medium- and high-pressure mercury bulbs have shown advantages over the single-wavelength spectral distribution from the low-pressure mercury bulb, shown as followed:

1. Several studies have found that the medium-pressure bulbs may have better inactivation effects onto E. coli as compared to the low-pressure bulbs, which is attributed to the multiple-wavelength spectral distribution of the medium-pressure bulbs and is supported by the following experimental observation: (1) E. coli can undergo photorepair following exposure to the low-pressure UV bulb, but no repair was detectable following exposure to the medium-pressure bulb with the same exposure dose. (2) The medium-pressure bulb is found to cause genetic damage as well as affect aromatic proteins, whereas the low-pressure bulb can only cause the genetic damage. [Cutler et al., Animal Health Research Reviews, 1011]

2. Some recent studies have shown that the common pathogens S6633 spores and MS2 Coliphage have different spectral sensitivities. In other words, multi-wavelength and/or broadband spectral distributions are desired to inactivate these two pathogens simultaneously and effectively. [Mamane-Gravetz et al, Environ. Sci. Technol., 1005]

Therefore it is necessary to have multiple-wavelength UV light sources for more efficient pathogen inactivation. In addition, the spectrum of the multiple-wavelength UV light source should be tunable upon the species of the pathogens in order to meet the pathogens' spectral sensitivity and achieve the most efficient pathogen inactivation through mechanisms such as aromatic proteins affection, and genetic damage.

Unfortunately, the spectral outputs of low-, medium- or high-pressure mercury-vapor bulbs are not tunable and cannot meet these requirements.

Other applications such as the curing of inks, coatings and adhesives as well as may also be advanced by introducing multiple-wavelength and/or broadband ultraviolet emissions.

Light-emitting diodes and laser diodes are semiconductor light emitters that can generate light upon a sufficient current injection. The light-emitting diode and laser diode are referred to as light-emitting device ("LEDs"). The wavelength of the light emitted by the LEDs typically depends on the property of the material from which the p-n junction is fabricated and the thin layer structure consisting of the active region of the LED.

Generally, an LED may consist of a substrate, an n-type region deposited on the substrate, a p-type region formed on the n-type doped epitaxial layer, or vice-versa. One or more active regions may be formed between the p-type doped epitaxial layer and the n-type doped epitaxial layer. The active region may consist of structures of single quantum wells, multiple-quantum wells, quantum wires, or quantum dots. A p-type electrode may be fabricated on a p-type doped epitaxial layer, and an n-type electrode contact may be formed on an n-type doped epitaxial layer, in order to facilitate the current flowing to the device from the power source. When an electrical current is applied to the LED, the holes and electrons may be injected into the active region from the p-type doped layer and the n-type doped layer, respectively. The radiative recombination of holes and electrons within active layer of the active region lead to photon generations.

So far, the visible LED has been widely applied to white light generation for illumination applications. Recently, the ultraviolet (UV)-LED has drawn considerable attention to the research and manufacturing. The UV-LEDs with emission wavelength of 250 nm to 400 nm have been realized in the laboratory and available to consumers. However, the current UV-LED only emits a single-wavelength spectral output. Hence in order to realize multiple wavelength and/or broadband spectral output, a number of UV-LEDs with different spectral outputs are needed, leading to potential problems of high cost, large size and non-uniform lifetime.

Accordingly, there still exists a need for devices which emit a multiple-wavelength and/or broadband spectral output in the ultraviolet wavelength range from 210 nm to 400 nm.

SUMMARY

According to a first embodiment, a monolithic semiconductor light emitting device is provided which comprises:

an n-type region;

a p-type region; and an active region of a multiple quantum well structure comprising a plurality of barrier layers and a plurality of active layers alternately laminated, wherein the active region is interposed between the n-type region and the p-type region;

wherein the device emits multiple single-wavelength spectral distributions of ultraviolet light each having a peak wavelength of between 210 nm and 400 nm and/or a broadband spectral output having a wavelength of between 210 nm and 400 nm.

According to a second embodiment, a monolithic semiconductor light emitting device comprising:

a substrate;

a first semiconductor layer of a first conductivity type on the substrate;

a raised region of the semiconductor material of the first conductivity type on the first semiconductor layer, the raised region having a plurality of exposed surfaces having different crystal orientations;

a first barrier layer on the plurality of exposed surfaces of the raised region;

a first active layer on the first barrier layer, wherein the first active layer comprises a first region having a first crystal orientation and capable of emitting a single-wavelength spectral distribution of ultraviolet light having a first peak wavelength of between 210 nm and 400 nm and a second region having a second crystal orientation different than the first crystal orientation and capable of emitting a single-wavelength spectral distribution of ultraviolet light having a second peak wavelength of between 210 nm and 400 nm, wherein the second peak wavelength is different than the first peak wavelength;

a second barrier layer on the first active layer; and a region of a semiconductor material of a second conductivity type different than the first conductivity type on the second barrier layer.

According to some embodiments, the first conductivity type can be n-type and the second conductivity type can be p-type. According to some embodiments, the first conductivity type can be p-type and the second conductivity type can be n-type. According to some embodiments, the device can comprise a plurality of active layers each of which are sandwiched between barrier layers. According to some embodiments, the active layers of the device can comprise additional regions having different crystal orientations and capable of emitting ultraviolet light having a different peak wavelength of between 210 nm and 400 nm.

According to a third embodiment, a method of making a monolithic semiconductor light emitting device, the method comprising:

depositing a first barrier layer on a first semiconductor layer, wherein the first semiconductor layer is on a semiconductor substrate;

depositing a first active layer on the first barrier layer;

depositing a second barrier layer on the first active layer;

depositing a second active layer on the second barrier layer;

depositing a third barrier layer on the second active layer;

depositing a second semiconductor layer on the third barrier layer;

wherein the first semiconductor layer is p-type and the second semiconductor layer is n-type or wherein the first semiconductor layer is n-type and the second semiconductor layer is p-type; and wherein the first active layer emits light having a first spectral distribution and having a first peak wavelength within the wavelength range of 210 nm to 400 nm; and wherein a second active layer emits light having a second spectral distribution having a second peak wavelength within the wavelength range of 210 nm to 400 nm, wherein the second peak wavelength is different than the first peak wavelength.

According to a fourth embodiment, a lamp is provided which comprises:

a substrate; and one or more monolithic semiconductor light emitting devices as set forth above;

wherein each of the one or more monolithic semiconductor light emitting device chips is mounted on the substrate; and wherein each of the one or more monolithic semiconductor light emitting device chips has a spectral distribution with a peak wavelength of between 210 nm and 400 nm.

According to some embodiments, the lamp comprises at least two of the monolithic semiconductor light emitting device chips.

According to some embodiments, the lamp further comprises one or more light conversion materials. The light conversion material can be configured to absorb at least part of the spectral distribution emitted by one of the monolithic semiconductor light emitting device chips and re-emit light having a different spectral distribution.

According to some embodiments, the lamp comprises a light emitting device chip having a single wavelength spectral distribution.

BRIEF DESCRIPTION OF THE DRAWINGS

The above and further advantages of the invention may be better understood by referring to the following description in conjunction with the accompanying drawings, in which:

FIGS. 4A-4D are top views of UV-LED lamps according to some embodiments of the present invention.

DETAILED DESCRIPTION

Figure 1:
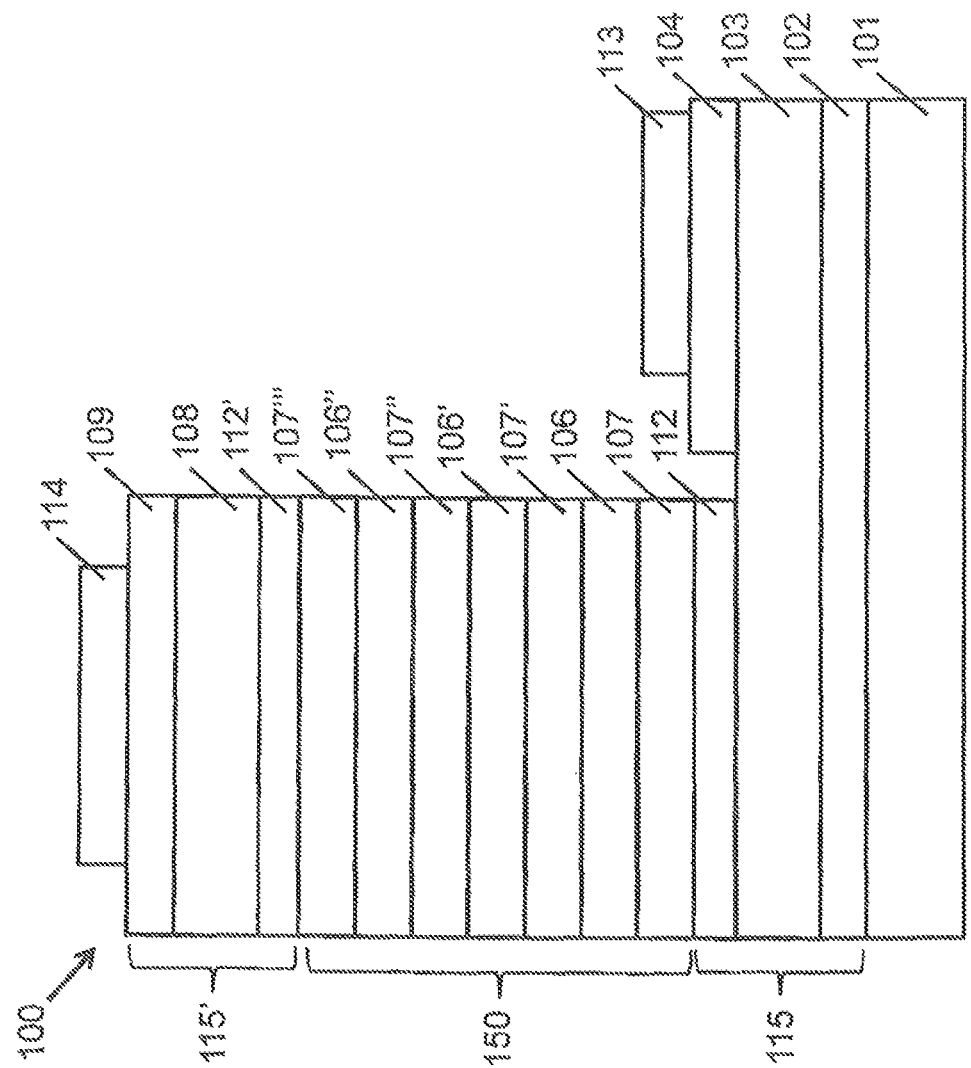
FIG. 1 is a cross-sectional view illustrating a UV-LED according to some embodiments of the present invention.

The present invention will be described more fully hereinafter with reference to the accompanying drawings, in which some, but not all embodiments of the invention are shown. Indeed, this invention may be embodied in many different forms and should not be construed as limited to the embodiments set forth herein; rather, these embodiments are provided so that this disclosure will be thorough and complete, and will fully convey the scope of the invention to those skilled in the art. In the drawings, the size and relative dimensions of layers and regions may be exaggerated for clarity. Like numbers refer to like elements throughout.

It will be understood that when an element such as a layer, region or substrate is referred to as being "on" another element, it can be directly on the other element or intervening elements may also be present. It will be understood that if part of an element, such as a surface, is referred to as "inner," it is farther from the outside of the device than other parts of the element. Furthermore, relative terms such as "beneath" or "overlies" may be used herein to describe a relationship of one layer or region to another layer or region relative to a substrate or based layer as illustrated in the figures. It will be understood that these terms are intended to encompass different orientations of the device in addition to the orientation depicted in the figures. The term "directly" means that there are no intervening elements. As used herein, the term "and/or" includes any and all combinations of one or more of the associated listed items.

It is to be understood that, although the terms "first", "second", etc. may be used herein to describe various elements, components, regions, layers and/or sections, these elements, components, regions, layers and/or sections, should not be limited by these terms. These terms are only used to distinguish one element, component, region, layer or section from another element, component, region, layer or section. Thus, a "first" element, component, region, layer or section discussed below could be termed a "second" element, component, region, layer or section without departing from the teachings of the present invention.

Embodiments of the invention are described herein with reference to cross-sectional, perspective, and/or plan-view illustrations that are schematic illustrations of idealized embodiments of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, a region illustrated or described as a rectangle may have rounded or curved features due to normal manufacturing tolerances. Thus, the layers and regions illustrated in the figures are schematic in nature and their shapes are not intended to illustrate the precise shape of a region or a shape of a device and are not intended to limit the scope of the invention.

It will be understood that all terms including technical and scientific terms used herein have the same meaning as commonly understood by those skilled in the art to which this invention belongs, unless otherwise defined. It will be also understood that terms, such as those defined in commonly used dictionaries, should be interpreted as having a meaning that is consistent with their meaning in the context of the relevant art and this specification will not be interpreted in an idealized or overly formal sense unless expressly so defined herein.

As used herein, the term "light-emitting device" and/or "LED" may refer to a light-emitting diode, laser diode and/or other semiconductor devices which comprise at least one solid state semiconductor layer, for example, silicon, silicon carbide, III-nitride compounds, and/or other semiconductor materials. Examples of III-nitride compounds may include GaN, AlN, InN, AlGaN, $Al_{0.85}Ga_{0.15}N$, $In_{0.1}Al_{0.7}Ga_{0.2}N$ and $In_{0.1}Ga_{0.99}N$. More generally, the notation (In, Al, Ga)N is used hereinafter to refer to a nitride compound $In_xAl_yGa_{1-x-y}N$. In the notation $In_xAl_yGa_{1-x-y}N$, $0 \leq x \leq 1$, $0 \leq y \leq 1$, and $x+y \leq 1$. A light-emitting device may or may not include a substrate such as a sapphire, silicon, silicon carbide, germanium, gallium nitride, aluminum nitride or other microelectronic substrates. A light-emitting device may include at least one contact which may comprise metal materials and/or other conductive materials such as graphite-based materials and indium-tin-oxide based materials. The design, growth and fabrication of conventional light-emitting devices are understood to those skilled in the art and need not to be described in detail herein.

As understood by those skilled in the art, a single-wavelength ultraviolet (UV) spectral distribution may refer to light emission primarily at a given wavelength in the UV range from 210 nm to 400 nm, for example, at 240 nm. The single-wavelength UV spectral distribution will also include light output, to a significantly reduced degree at the surrounding wavelengths. Thus, for example, if an LED emits light primarily at 240 nm, it should be understood that the LED can also generate some light at surrounding wavelengths, for example, from 240 nm to 260 nm, to a significantly reduced degree. As understood by those skilled in the art, the spectral bandwidth with respect to the primary wavelength is generally characterized by its full width at half maximum (FWHM). FWHM is an expression of the extent of a function, given by the difference between the two extreme values of the independent variable such as wavelength at which the dependent variable such as spectral intensity is equal to half of its maximum value. As used herein, the FWHM refers to the wavelength width in nanometers (nm) of a spectral distribution at half of its maximum value. According, the single-wavelength UV spectral distribution may herein refer to the light emission primarily at a given wavelength corresponding to a peak emission with a FWHM of equal or less than 20 nm.

As understood by those skilled in the art, a multiple-wavelength UV spectral distribution may refer to light emissions such as a superposition of multiple single-wavelength spectral distributions with various peak wavelengths in the range of 210 nm to 400 nm, for example, at 230 nm, 250 nm, and 270 nm, wherein the peak emissions can be either maximum peak emission or local peak emission. It is understood that the peak wavelength(s) of the spectral distribution of spectral output from a multiple-quantum well active region, is mainly determined by bandgaps of active layers but also influenced by many factors such as, active layer thickness, spontaneous and piezoelectric polarization fields, and free carrier density. Therefore the values of peak wavelengths in the following embodiments and examples may refer to approximate values mainly determined by the bandgaps.

It is to be understood that, broadband is a relative term, describing a relatively wide range or bandwidth of wavelengths or frequencies. Therefore, herein a broadband UV spectral distribution may refer to a spectral distribution with FWHW of larger than 20 nm. For example, a broadband UV spectral distribution may also refer to a spectral distribution formed by partial or full overlapping of more than one single-wavelength emissions, the FWHW of which is larger than 20 nm. It is to be understood that "multiple-wavelength and/or broadband" refers to a spectral distribution including either a multiple-wavelength spectral distribution or a broadband spectral distribution or both.

In summary, the spectral output of present invention has a spectral distribution that differs from a single-wavelength spectral distribution typically observed in the spectral output of a conventional LED. For example, the present invention's spectral output may have a multiple single-wavelength distribution, a "top-flat" or substantially uniform distribution, a Laplace-shaped distribution, a bimodal distribution, a sawtooth distribution, a multimodal distribution, and/or a distribution that include at least one of these distributions, most of or all of which are in the UV wavelength range.

In addition, a carrier-free flat-band model without the consideration of spontaneous and piezoelectric polarization fields will be used to plot band diagrams of active regions and barrier layers in FIGS. 2A-2E. It is to be understood that the band diagrams are approximate and illustrative, and as such, may be modified by the spontaneous and piezoelectric polarization fields, and free carriers. Referring now to the present invention in more detail, in FIG. 1, there is a cross-sectional view illustrating a monolithic semiconductor multiple-wavelength and/or broadband UV-LED 100. Semiconductor layers of UV-LED 100 may respectively comprise at least one of indium aluminum gallium nitride, indium aluminum nitride, indium gallium nitride, indium nitride, aluminum gallium nitride, gallium nitride, aluminum nitride and other compound semiconductor materials. The UV-LED 100 includes a multiple-quantum well active region 150 which may be formed between two n-type and p-type regions 115 and 115', respectively. An n-type contact layer 104 and a p-type contact layer 109 may be formed on an n-type cladding layer 103 and a p-type cladding layer 108, respectively. The n-type and p-type confinement layers 112 and 112' may be formed between the n-cladding layer 103 and the active region 150, the p-cladding layer 108 and the active region 150, respectively. The contact layers 104 and 109 may be doped differently from the cladding layers 103 and 108, used for carrier spreading. In addition, the UV-LED 100 may or may not include a substrate 101, on which a buffer layer 102 may be formed. Additionally, the UV-LED 100 may or may not include one or more n-type and p-type capping layers (not shown) below the n-type contact layer 104 and p-type contact layer 109, respectively. The active region 150 consisting of the multiple-quantum well structure includes a plurality of alternating active layers 106, 106', and 106", and barrier layers 107, 107', 107" and 107'". The active layers 106, 106', and 106" are respectively sandwiched by two barrier layers 107 and 107', 107' and 107", and 107" and 107'". It is understood that the numbers of active layers and barrier layers are approximate and illustrative, and as such, may be respectively varied in some other embodiments to obtain a desired spectral output. Stoichiometry and composition of a semiconductor material may change from layer to layer, in addition to varying from within a specific layer. The active layers 106, 106', and 106" may be respectively configured to comprise different materials, material compositions, material inhomogeneities, strain inhomogeneities, defect states, thicknesses, shapes, and/or doping types and concentrations, from layer to layer or within a specific layer, in order that upon an appropriate power source connecting to an n-type electrode 113 and a p-type electrode 114, each of the active layers 106, 106', and 106" emits a desired spectral distribution in the range of 210 nm to 400 nm, which may additively combine to provide a desired multiple-wavelength and/or broadband UV spectral output. Similarly, the barrier layers 107, 107', 107", and 107'" may be respectively configured to different materials, material compositions, material inhomogeneities, strain inhomogeneities, defect states, thicknesses, shapes, and/or doping types and concentrations, from layer to layer or within a specific layer, in order that each barrier layer has a larger bandgap than the adjacent active layer for carrier confinement. Meanwhile, the chosen configurations of the active layers 106, 106', and 106" and barrier layers 107, 107', 107", and 107'" may lead to desired radiative recombination and hole transportation efficiencies, reduced efficiency droop, and/or reduced unwanted polarization field. The configurations of the active layers 106, 106', and 106" and barrier layers 107, 107', 107", and 107'" and other semiconductor layers may be done by adjusting the growth parameters such as the growth time, growth rate, partial pressure of the growth species, growth pressure, doping conditions, temperature, and V/III ratio. Changes such as these may be made during growth of the active layers and barrier layers. It should be noted that the spectral output of the active region 150 may be changed upon the change of characteristics of the power source and occurrence of quantum effects, for example, carrier screening effect, junction heating effect, and quantum-confined Stark effect. It is to be understood that in some embodiments one or more of the active layers 106, 106', and 106" and barrier layers 107, 107', 107", and 107'" may include more than one compound material. For example, the active layer 106 may include a first layer of $Al_xGa_{1-x}N$ and a second layer of $In_yAl_{1-y}N$. Alternatively, a desired multiple-wavelength and/or broadband UV spectral output of the active region 150 in the range of 210 nm and 400 nm may be obtained by associating the active regions with various crystal planes, for example, a polar plane (0001), a semi-polar plane (11-22), and/or non-polar plane (11-20), which will be illustrated in FIG. 3A. The n-type and p-type confinement layers 112 and 112' may be intentionally configured in order that the desired carrier confinement, the reduced lattice mismatch and strain between the active region 150 and cladding layers 103 and 108, and/or desired bandgap energy offsets between the cladding layers 103 and 108, and barrier layers 107 and 107' are achieved. It is understood that the configuration of a different number of the confinement layers may be employed in some embodiments.

According to some embodiments of FIG. 1, FIGS. 2A-2D illustrates multiple-wavelength and broadband UV-LEDs.

Figure 2A:
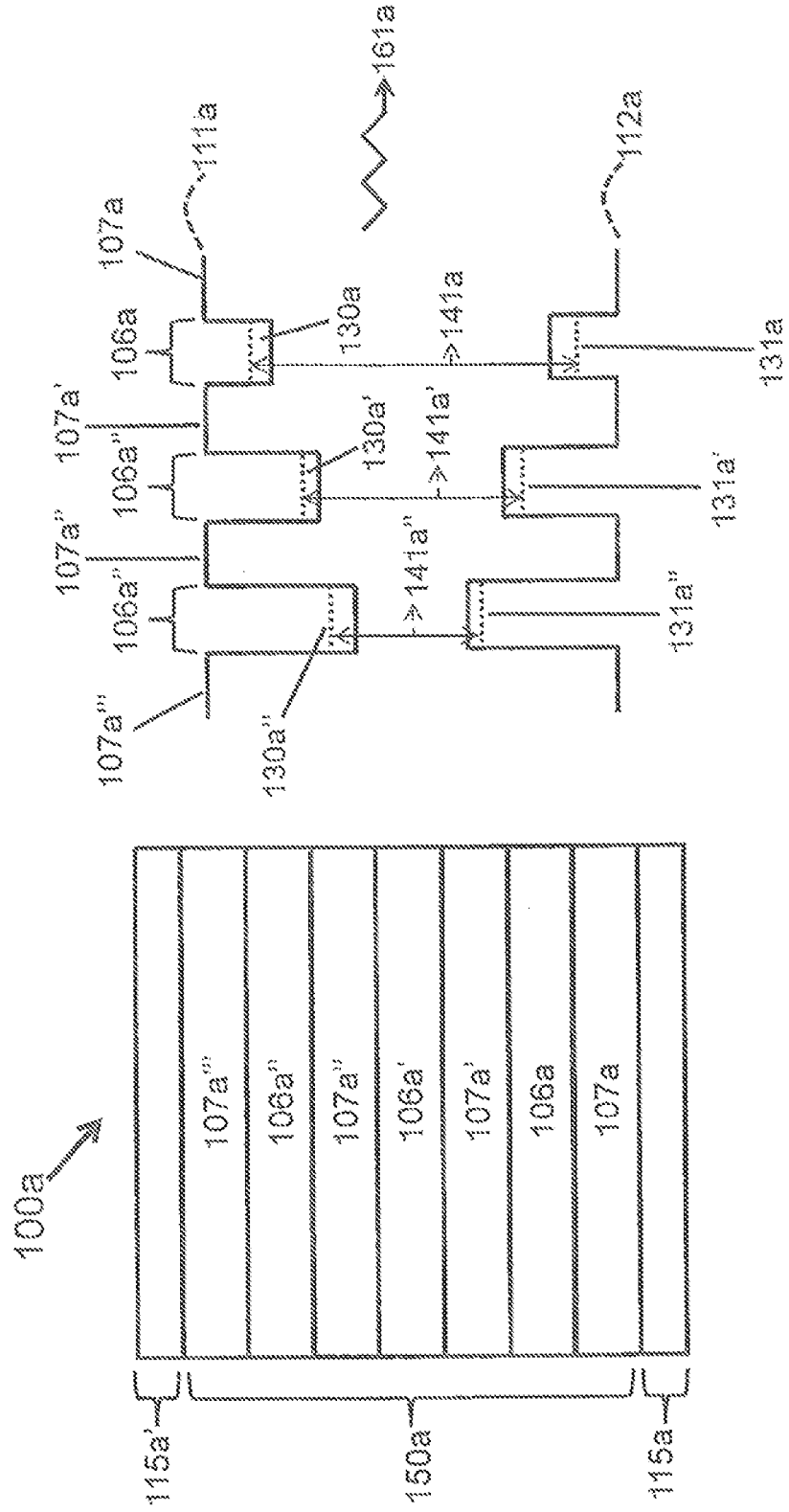
FIGS. 2A-2E are cross-section views and corresponding energy band diagrams illustrating active regions in UV-LEDs according to some embodiments of the present invention.

FIG. 2A illustrates an active region 150a of an LED 100a and a corresponding energy band diagram of the active region 150a according to some embodiments of FIG. 1, which includes an aluminum gallium nitride ($Al_xGa_{1-x}N$) based active region 150a formed between an n-type region 115a and a p-type region 115a'. In the notation $Al_xGa_{1-x}N$, $0 \leq x \leq 1$. The AlGaN-based active region 150a is a multiple-quantum well structure including a plurality of alternating barrier layers 107a, 107a', 107a" and 107a'", and active layers 106a, 106a', and 106a". It is understood that the numbers of active and barrier layers are approximate and illustrative, and as such, may be changed in some other embodiments to obtain a desired spectral output. For the AlGaN-based active region 150a, the active layers 106a, 106a', and 106a" and barrier layers 107a, 107a', 107a" and 107a'" may be respectively configured to comprise different material compositions, material inhomogeneities, strain inhomogeneities, defect states, thicknesses, shapes, and/or doping types and concentrations, from layer to layer or within a specific layer to define a plurality of quantum wells and barriers, and corresponding interband transitions energies which may be defined by the differences between conduction subband energy levels and valence subband energy levels within the quantum wells, i.e., 130a and 131a, 130a' and 131a', 130a" and 131a", respectively. To obtain the illustrative energy band diagram in FIG. 2A, for example, the molar flow rate of aluminum precursor m_Al and the molar flow rate of gallium precursor m_Ga may be configured in such a way that the ratio of m_Al/m_Ga when growing the active layer 106a is larger than the ratio of m_Al/m_Ga when growing the active layer 106a', and the ratio of m_Al/m_Ga when growing the active layer 106a' is larger than the ratio of m_Al/m_Ga when growing the active layer 106a". To achieve the illustrative energy band diagram in FIG. 2A, the $NH_3$ molar flow rate and thus V/III ratio may be changed too. The V/III ratio is defined as the molar flow rate of combined column-V precursors divided by the combined column-III molar flow rates. The $NH_3$ molar flow rate may encourage incorporation of gallium and thus be in proportional to the gallium composition in the $Al_xGa_{1-x}N$ materials at certain growth conditions suitable for high-quality $Al_xGa_{1-x}N$ materials. More specifically, the $NH_3$ molar flow rate and thus V/III ratio may be configured in such a way that the $NH_3$ molar flow rate when growing the active layer 106a is lower than that when growing the active layer 106a'. The NH$_3$ molar flow rate when growing the active layer 106a' is lower than that when growing the active layer 106a". Typically the molar flow rate is recorded by devices like mass flow controller. However, under certain conditions the premature reaction between the intermixed precursors may occur before they reach the substrate surface. By adjusting the growth conditions such as V/III ratio, precursor flow pattern and intermixing time, the premature reaction may be reduced. The molar flow rate or the ratio of molar flow rate mentioned above may refer to the molar flow rate at the substrate surface. To achieve the illustrative energy band diagram in FIG. 2A, for another example, the molar flow rate of different precursors may be kept the same during the growth of the active layers 106a, 106a', and 106", but the growth temperatures of the active layers 106a, 106a', and 106a" are configured in such a way that the temperature of growing the active layer 106a is higher than that of 106a'. The temperature of growing the active layer 106a' is higher than that of 106a". The aluminum incorporation may be in proportional to the growth temperature, and hence varying growth temperatures of the active layers can lead to different material compositions and thus emission wavelengths. The growth temperature may be adjusted by, for example, varying the voltage and current of the heater or changing the distance between the heater and the susceptor, or molar flow rates of certain carrier gases or precursors. For another example, with the fixed molar flow rate of precursors and temperatures and hence growth rate, the growth times of the active layers 106a, 106a', and 106a" are varied such that their layer thicknesses are different, which leads to different transition energies and thus emission wavelengths. More specifically, a thicker active layer may produce smaller transition energy and thus longer wavelength compared to a thinner active layer assuming the other of their profiles are the same. Common group-III precursors include but are not limited to trimethylgallium, triethylgallium, and trimethylalumium. The methods described above in this paragraph may also be applicable for embodiments illustrated in FIGS. 2B-2E and thus will not be repeated as followed.

It is understood that the conduction subband energy levels 130a, 130a' and 130a" and valence subband energy levels 131a, 131a' and 131a" in the above examples are approximate and illustrative, and as such, herein the conduction subbands and valance subbands refer to all the conduction subbands and valence subbands that contribute to the radiative recombination within the active region 150a. Accordingly, electrons and holes in the active layers 106a, 106a', and 106a" may recombine radiatively and have spectral distributions 141a, 141a', and 141a" with wavelengths consistent with the corresponding interband transitions energies, which addictively combine to provide a desired multiple-wavelength and/or broadband UV spectral output 161a. For example, the active layers 106a, 106a', and 106a" may consist of Al$_x$Ga$_{1-x}$N, where the average aluminum composition x may be in the range of about 0.43≤x≤0.77, corresponding to a wavelength range about 230 nm to 300 nm. More particularly, the active layer 106a may consist of Al$_x$Ga$_{1-x}$N where the average aluminum composition x is about 0.77. The active layer 106a' may consist of Al$_y$Ga$_{1-y}$N where the average aluminum composition y is about 0.65. The active layer 106a" may consist of Al$_z$Ga$_{1-z}$N where the average aluminum composition z is about 0.32. Accordingly, the active layers 106a, 106a', and 106a" may have three single-wavelength spectral distributions 141a, 141a', and 141a" with primary wavelengths at about 230 nm, 255 nm and 300 nm, respectively. For another example, the aluminum and gallium composition may vary over a thickness of at least one of the active layers 106a, 106a', and 106a" to provide stepwise and/or continuous grading. For another example, the active layers 106a, 106a', and 106a" and barrier layers 107a, 107a', 107a" and 107a''' may have equal or different thicknesses which may result in varying interband transition energies, for example, from about 0.5 nm to 20 nm, and from about 1 nm to 50 nm, respectively. As illustrated in the energy band diagram of FIG. 2A, the energy levels of a conduction band edge 111a and a valence band edge 112a are shown schematically. The energy levels are related with the configurations used to form the active layers 106a, 106a', and 106a" and the barrier layers 107a, 107a', 107a" and 107a'''. It is to be understood that although illustrated as each including the same relative composition of AlGaN and thus the same bandgap, the barrier layers 107a, 107a', 107a" and 107a''' may of different or graded stoichiometries in some embodiments, as will be discussed in detail below with reference to FIG. 2E. Additionally, although illustrated as each having chosen stoichiometries to provide sequentially decreasing bandgap energies (from 106a, 106a' to 106a"), other stoichiometries may also be used for the active layers 106a, 106a' and 106a", and/or within at least one of the active layers 106a, 106a', and 106a", as will be discussed in detail below with reference to FIG. 2E.

Figure 2B:
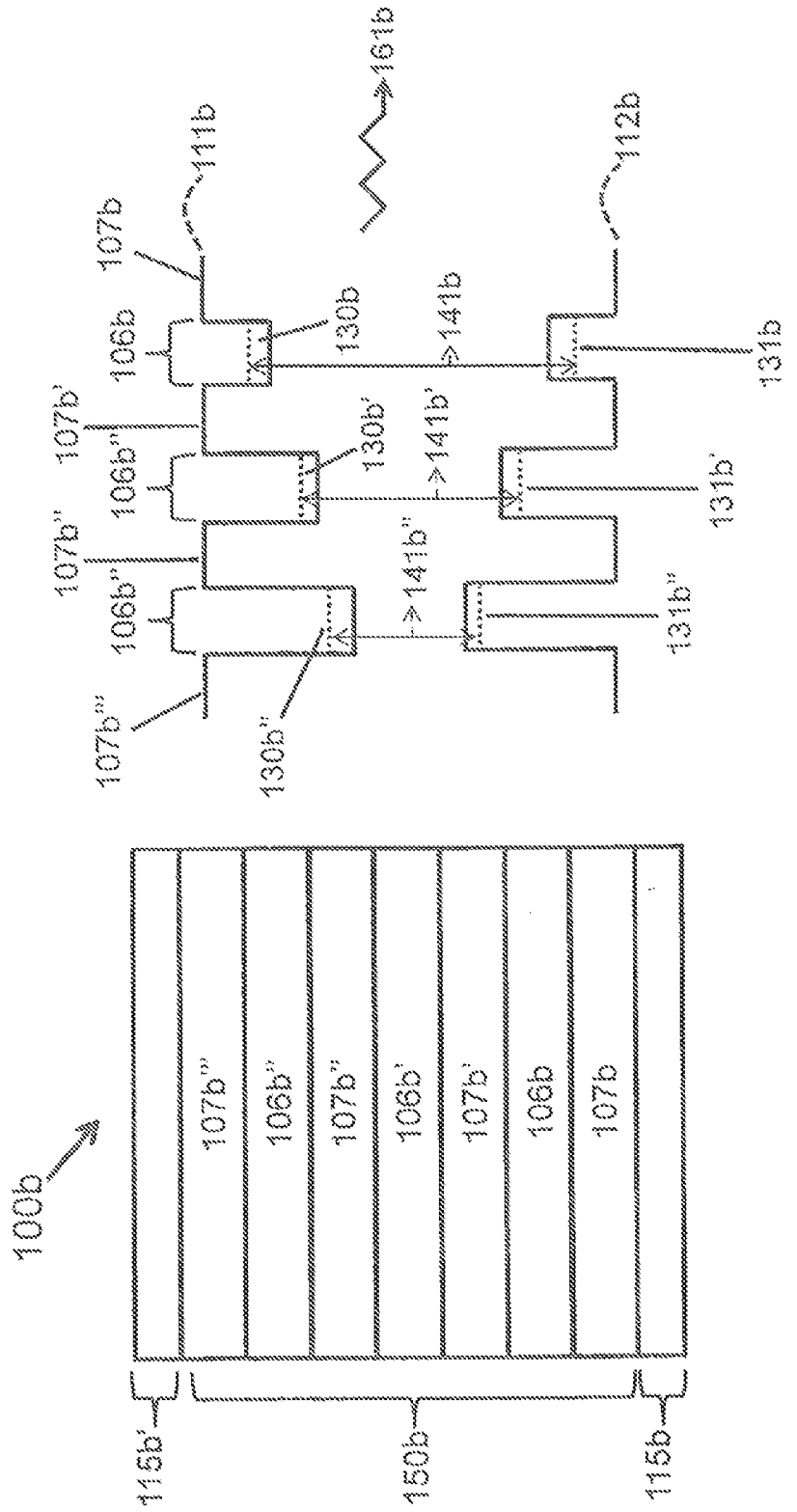

FIG. 2B illustrates an active region 150b of an LED 100b and a corresponding energy band diagram of the active region 150b according to some embodiments of FIG. 1, which includes an indium aluminum gallium nitride (In$_x$Al$_y$Ga$_{1-x-y}$N) based active region 150b formed between a n-type region 115b and a p-type region 115b'. In the notation In$_x$Al$_y$Ga$_{1-x-y}$N, 0≤x≤1, 0≤y≤1, and x+y≤1. The InAlGaN-based active region 150b is a multiple-quantum well structure including a plurality of alternating InAlGaN active layers 106b, 106b', and 106b", and barrier layers 107b, 107b', 107b" and 107b'''. It is understood that the numbers of active and barrier layers are approximate and illustrative, and as such, may be changed in some other embodiments to obtain a desired spectral output. For the InAlGaN-based active region 150b, the active layers 106b, 106b', and 106b" and barrier layers 107b, 107b', 107b" and 107b''' may be respectively configured to comprise different material compositions, material inhomogeneities, strain inhomogeneities, defect states, thicknesses, shapes, and/or doping types and concentrations, from layer to layer or within a specific layer to define a plurality of quantum wells and barriers, and corresponding interband transitions energies which may be defined by the differences between conduction subband energy levels and valence subband energy levels within the quantum wells, i.e., 130b and 131b, 130b' and 131b', 130b" and 131b", respectively. It is understood that the conduction subband energy levels 130b, 130b' and 130b" and valence subband energy levels 131b, 131b' and 131b" in the above examples are approximate and illustrative, and as such, herein the conduction subbands and valance subbands refer to all the conduction subbands and valence subbands that contribute to the radiative recombination within the active region 150b. Accordingly, electrons and holes in the active layers 106b, 106b', and 106b" may recombine radiatively and have spectral distributions 141b, 141b', and 141b" with wavelengths consistent with the corresponding interband transitions energies, which addictively combine to provide a desired multiple-wavelength and/or broadband UV spectral output 161b. A small amount of indium may be incorporated into at least one of the active layers to take advantage of the indium segregation effects, by which the intensity of multiple-wavelength and/or broadband spectral output 161b of LED 100b may be less sensitive to the threading dislocation density. For example, the active layers 106b, 106b', and 106b" may consist of In$_x$Al$_y$Ga$_{1-x-y}$N, where the average indium composition x and aluminum composition y may be in the range of about $0 \leq x \leq 0.05$ and $0 < y < 1$, respectively, which may correspond to three spectral distributions 141$b$, 141$b'$, and 141$b''$ in a wavelength range about 210 nm to 360 nm. For another example, the active layers 106$b$, 106$b'$, and 106$b''$ may consist of $In_xAl_yGa_{1-x-y}N$ where the average indium composition x is about less than 0.01, while the aluminum composition y may be in the range of about 0.35 to 0.99, respectively, which may correspond to three spectral distributions 141$b$, 141$b'$, and 141$b''$ in a wavelength range from 280 nm to 210 nm. In some other embodiments, indium may not be incorporated in the active layers and barrier layers, for example, as discussed in details above with reference to FIG. 2A. For another example, the indium, aluminum and gallium compositions may vary over a thickness of at least one of the active layers 106$b$, 106$b'$, and 106$b''$ to provide stepwise and/or continuous grading. For another example, the active layers 106$b$, 106$b'$, and 106$b''$ and barrier layers 107$b$, 107$b'$, 107$b''$ and 107$b'''$ may have equal or different thicknesses which may result in varying interband transition energies, for example, between about 0.5 nm and 20 nm, and about 1 nm and 50 nm, respectively. As illustrated in the energy band diagram of FIG. 2B, the energy levels of a conduction band edge 111$b$ and a valence band edge 112$b$ are shown schematically. The energy levels are related with the configurations used to form the active layers 106$b$, 106$b'$, and 106$b''$ and the barrier layers 107$b$, 107$b'$, 107$b''$ and 107$b'''$. It is to be understood that although illustrated as each including the same relative composition of InAlGaN and thus the same bandgap, the barrier layers 107$b$, 107$b'$, 107$b''$ and 107$b'''$ may be of different or graded stoichiometries in some embodiments, as will be discussed in detail below with reference to FIG. 2E. Additionally, although illustrated as each having chosen stoichiometries to provide sequentially decreasing bandgap energies (from 106$b$, 106$b'$, and 106$b''$), other stoichiometries may also be used for the active layers 106$b$, 106$b'$, and 106$b''$, and/or within at least one of the active layers 106$b$, 106$b'$, and 106$b''$, as will be discussed in detail below with reference to FIG. 2E.

Figure 2C:
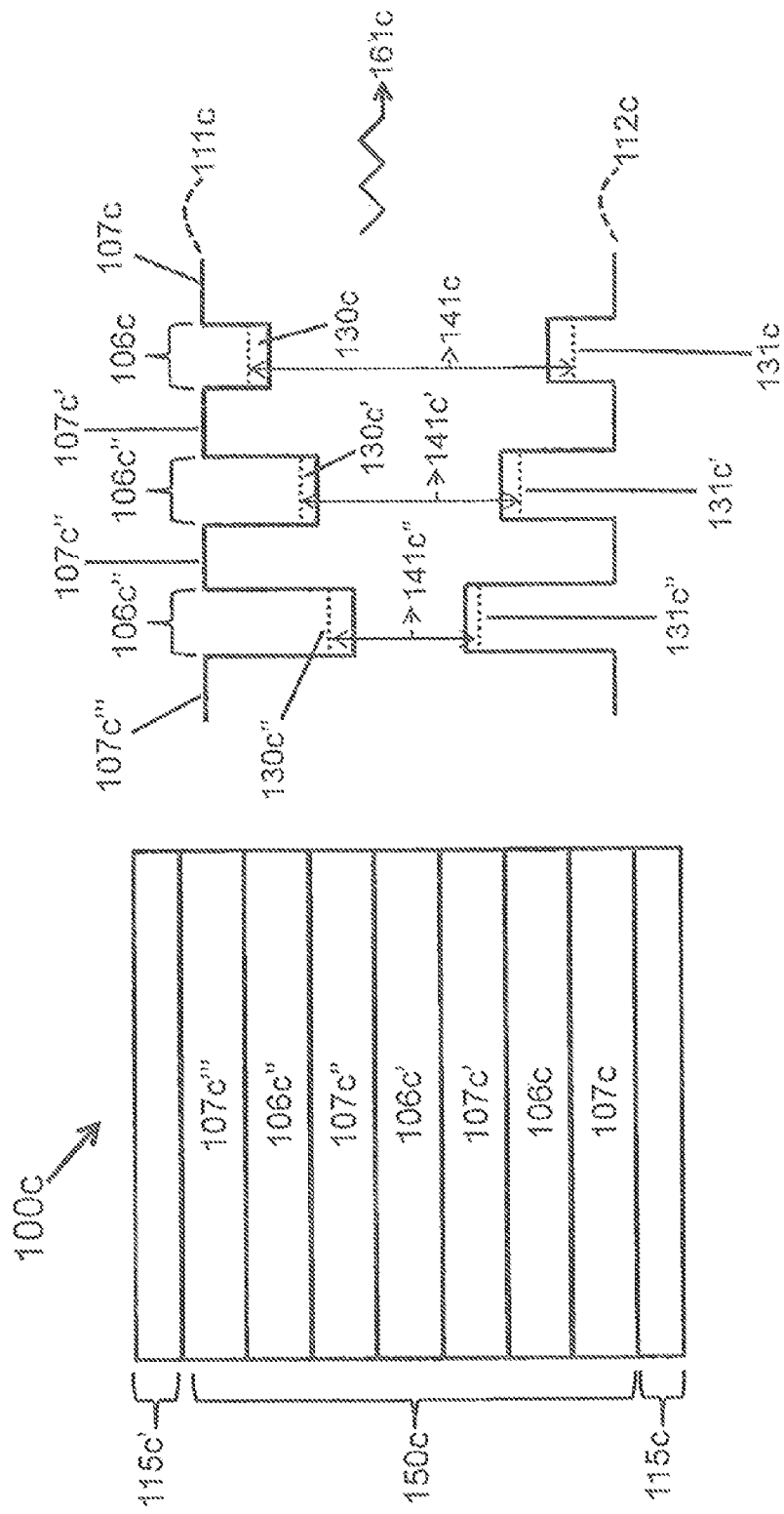

FIG. 2C illustrates an active region 150$c$ of an LED 100$c$ and a corresponding energy band diagram of the active region 150$c$ according to some embodiments of FIG. 1, which includes an aluminum nitride (AlN) and aluminum gallium nitride ($Al_xGa_{1-x}N$) based active region 150$c$ formed between an n-type region 115$c$ and a p-type region 115$c'$. In the notation $Al_xGa_{1-x}N$, $0 \leq x < 1$. The AlGaN-AlN based active region 150$c$ is a multiple-quantum well structure including a plurality of alternating barrier layers 107$c$, 107$c'$, 107$c''$ and 107$c'''$, and active layers 106$c$, 106$c'$, and 106$c''$. It is understood that the numbers of active and barrier layers are approximate and illustrative, and as such, may be changed in some other embodiments to obtain a desired spectral output. For the AlGaN-AlN based active region 150$c$, the active layers 106$c$, 106$c'$, and 106$c''$ and barrier layers 107$c$, 107$c'$, 107$c''$ and 107$c'''$ may be respectively configured to comprise different material compositions, material inhomogeneities, strain inhomogeneities, defect states, thicknesses, shapes, and/or doping types and concentrations, from layer to layer or within a specific layer to define a plurality of quantum wells and barriers, and corresponding interband transitions energies which may be defined by the differences between conduction subband energy levels and valence subband energy levels within the quantum wells, i. e., 130$c$ and 131$c$, 130$c'$ and 131$c'$, 130$c''$ and 131$c''$, respectively. It is understood that the conduction subband energy levels 130$c$, 130$c'$ and 130$c''$ and valence subband energy levels 131$c$, 131$c'$ and 131$c''$ in the above examples are approximate and illustrative, and as such, the conduction subbands and valance subbands refer to all the conduction subbands and valence subbands that contribute to the radiative recombination within the active region 150$c$. Accordingly, electrons and holes in the active layers 106$c$, 106$c'$, and 106$c''$ may recombine radiatively and have spectral distributions 141$c$, 141$c'$, and 141$c''$ with wavelengths consistent with the corresponding interband transitions energies, which addictively combine to provide a desired multiple-wavelength and/or broadband UV spectral output 161$c$. For example, the active layers 106$c$, 106$c'$, and 106$c''$ may consist of $Al_xGa_{1-x}N$, where the average aluminum composition x may be in the range of about $0.53 \leq x \leq 0.85$, corresponding to light emission from about 220 nm to 270 nm. More particularly, the active layer 106$c$ may consist of $Al_xGa_{1-x}N$ where the average aluminum composition x is about 0.85. The active layer 106$c'$ may consist of $Al_yGa_{1-y}N$ where the average aluminum composition y is about 0.69. The active layer 106$c''$ may consist of $Al_zGa_{1-z}N$ where the average aluminum composition z is about 0.53. Accordingly, the active layers 106$c$, 106$c'$, and 106$c''$ may have three single-wavelength spectral distributions 141$c$, 141$c'$, and 141$c''$ with primary wavelengths at about 220 nm, 243 nm and 270 nm, respectively. For another example, the aluminum and gallium composition may vary over a thickness of at least one of the active layers 106$c$, 106$c'$, and 106$c''$ to provide stepwise and/or continuous grading. For another example, the active layers 106$c$, 106$c'$, and 106$c''$ and barrier layers 107$c$, 107$c'$, 107$c''$ and 107$c'''$ may have equal or different thicknesses which may result in varying interband transition energies, for example, between about 0.5 nm and 20 nm, and about 1 nm and 50 nm, respectively. As illustrated in the energy band diagram of FIG. 2C, the energy levels of a conduction band edge 111$c$ and a valence band edge 112$c$ are shown schematically. The energy levels are related with the configurations used to form the active layers 106$c$, 106$c'$, and 106$c''$ and the barrier layers 107$c$, 107$c'$, 107$c''$ and 107$c'''$. It is to be understood that although illustrated as each having chosen stoichiometries to provide sequentially decreasing bandgap energies (from 106$c$, 106$c'$ to 106$c''$), other stoichiometries may also be used for the active layers 106$c$, 106$c'$ and 106$c''$, and/or within at least one of the active layers 106$c$, 106$c'$, and 106$c''$, as will be discussed in detail below with reference to FIG. 2E.

Figure 2D:
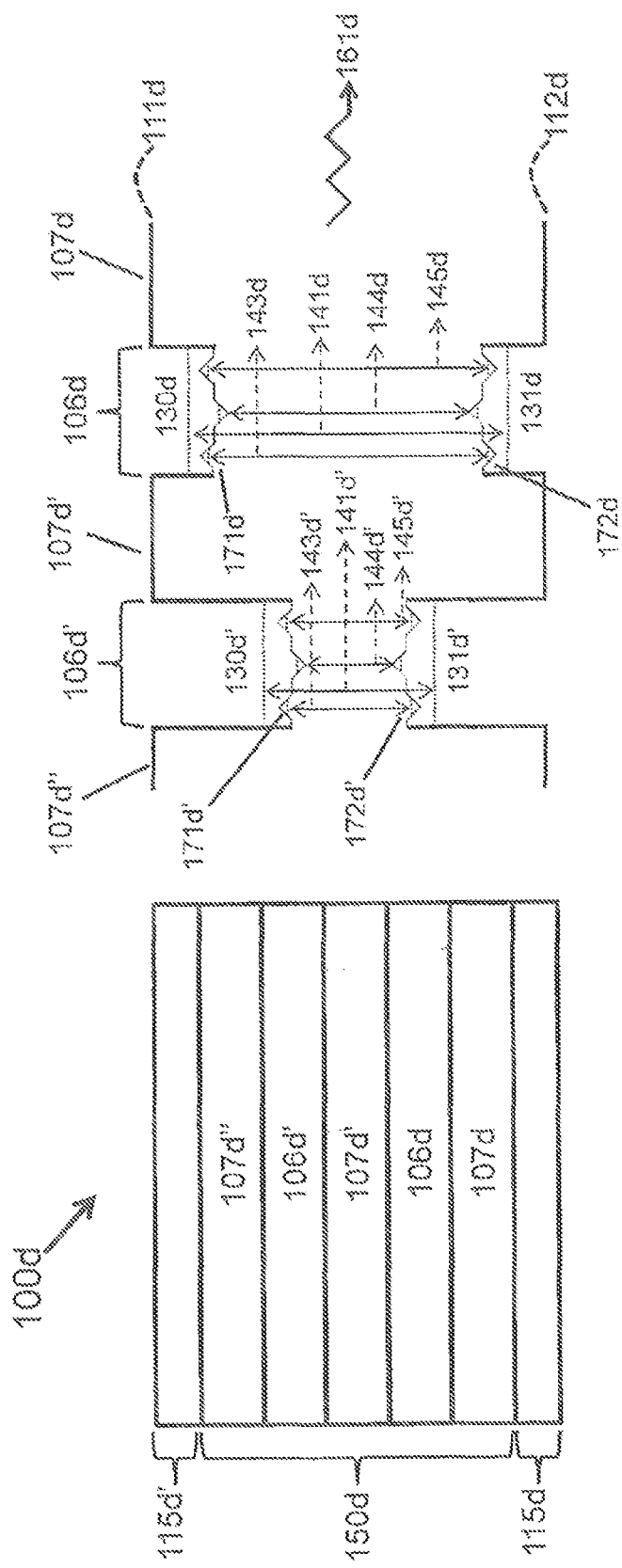

FIG. 2D illustrates an active region 150$d$ of an LED 100$d$ and a corresponding energy band diagram of the active region 150$d$ according to some embodiments of FIG. 1, which includes an indium aluminum gallium nitride ($In_xAl_yGa_{1-x-y}N$) based active region 150$d$ formed between an n-type region 115$d$ and a p-type region 115$d'$. In the notation $In_xAl_yGa_{1-x-y}N$, $0 \leq x \leq 1$, $0 \leq y \leq 1$, and $x+y \leq 1$. Herein $In_xAl_yGa_{1-x-y}N$ or InAlGaN as followed may refer to at least one of AlGaN, InAlGaN, GaN, AN, InAlN, InGaN and InN. The InAlGaN-based active region 150$d$ is a multiple-quantum well structure including a plurality of alternating barrier layers 107$d$, 107$d'$, and 107$d''$, and active layers 106$d$ and 106$d'$. It is understood that the numbers of active and barrier layers are approximate and illustrative, and as such, may be changed in some other embodiments to obtain a desired spectral output. For the InAlGaN-based active region 150$d$, the active layers 106$d$, and 106$d'$ and barrier layers 107$d$, 107$d'$, and 107$d''$ may be respectively configured to comprise different material compositions, material inhomogeneities, strain inhomogeneities, defect states, thicknesses, shapes, and/or doping types and concentrations, from layer to layer or within a specific layer to define a plurality of quantum wells and barriers, and corresponding interband transitions energies which may be defined by the differences between conduction subband energy levels and valence subband energy levels within the quantum wells, i. e., 130$d$ and 131$d$, 130$d'$ and 131$d'$, respectively. It is understood that the conduction subband energy levels 130$d$ and 130$d'$ and valence subband energy levels 131$d$ and 131$d'$ in the above examples are approximate and illustrative, and as such, the conduction subbands and valance subbands refer to all the conduction subbands and valence subbands that contribute to the radiative recombination within the active region 150$d$. Accordingly, electrons and holes in the active layers 106$d$ and 106$d'$ may recombine radiatively and have spectral distributions 141$d$ and 141$d'$ with wavelengths consistent with the corresponding interband transitions energies, which addictively combine to provide a desired multiple-wavelength and/or broadband UV spectral output 161$d$. A small amount of indium may be incorporated into at least one of the active layers to take advantage of the indium segregation effects, by which the intensity of multiple-wavelength and/or broadband spectral output 161$d$ of LED 100$d$ may be less sensitive to the threading dislocation density. For example, the active layers 106$d$ and 106$d'$ may consist of In$_x$Al$_y$Ga$_{1-x-y}$N, where the average indium composition x and aluminum composition y may be in the range of about 0≤x≤0.05 and 0<y<1, respectively, which may correspond to two spectral distributions 141$d$ and 141$d'$ in a wavelength range about 210 nm to 360 nm. For another example, the active layers 106$d$ and 106$d'$ may consist of In$_x$Al$_y$Ga$_{1-x-y}$N where the average indium composition x is about less than 0.01, while the aluminum composition y may be in the range of about 0.35 to 0.99, respectively, which may correspond to three spectral distributions 141$d$ and 141$d'$ in a wavelength range from 280 nm to 210 nm. In some other embodiments, indium may not be incorporated in the active layers and barrier layers, for example, as discussed in details above with reference to FIG. 2B. For another example, the composition of indium aluminum and gallium may vary over a thickness of at least one of the active layers 106$d$ and 106$d'$ to provide stepwise and/or continuous grading. For another example, the active layers 106$d$ and 106$d'$ and barrier layers 107$d$, 107$d'$ and 107$d''$ may have equal or different thicknesses which may result in varying interband transition energies, for example, between about 0.5 nm and 20 nm, and about 1 nm and 50 nm, respectively. As illustrated in the energy band diagram of FIG. 2A, the energy levels of a conduction band edge 111$d$ and a valence band edge 112$d$ are shown schematically. The energy levels are related with the configurations used to form the active layers 106$d$ and 106$d'$ and the barrier layers 107$d$, 107$d'$ and 107$d''$.

Still referring to FIG. 2D, it is understood by those skilled in the art that, while active layers 106$d$ and 106$d'$ may be formed with specific InAlGaN materials to emit target spectral distributions 141$d$ and 141$d'$, respectively, the relative composition of the InAlGaN materials and strain between the active layers and barrier layers may be inhomogeneous, and/or defect-state induced energy levels exist in the active layers, and as such, there may be some energy level variations 171$d$ and 171$d'$ in the conduction bands, and 172$d$ and 172$d'$ in the valence bands of the active layers 106$d$ and 106$d'$, respectively. It is understood that the some energy level variations 171$d$ and 171$d'$ in the conduction bands, and 172$d$ and 172$d'$ in the valence bands as illustrated in the drawing are illustrative and approximate, and as such, refer to all the energy level variations in the conduction bands and valence bands which contribute to the formation of new interband transition energy levels. Hence the number of interband transition energies may increase and the corresponding spectral distributions 143$d$, 143$d'$, 144$d$, 144$d'$, 145$d$, and 145$d'$ may be emitted, which additively combine with the target spectral distributions 141$d$ and 141$d'$ to produce a multiple-wavelength and/or broadband UV spectral output 161$d$ in the range of about 210 nm to 400 nm. It is understood that the quantities of interband transition energy variations and corresponding emission wavelengths in the above example are approximate and illustrative, and as such, may vary in some other embodiments to obtain a desired spectral output. It is to be understood that although illustrated as each including the same relative composition of AlGaN and thus the same bandgap, the barrier layers 107$d$, 107$d'$ and 107$d''$ may of different or graded stoichiometries in some embodiments, as will be discussed in detail below with reference to FIG. 2E. Additionally, although illustrated as each having chosen stoichiometries to provide sequentially decreasing bandgap energies (from 106$d$ and 106$d'$), other stoichiometries may also be used for the active layers 106$d$, 106$d'$ and 106$d''$, and/or within at least one of the active layers 106$d$, 106$d'$, and 106$d''$, as will be discussed in detail below with reference to FIG. 2E.

Figure 2E:
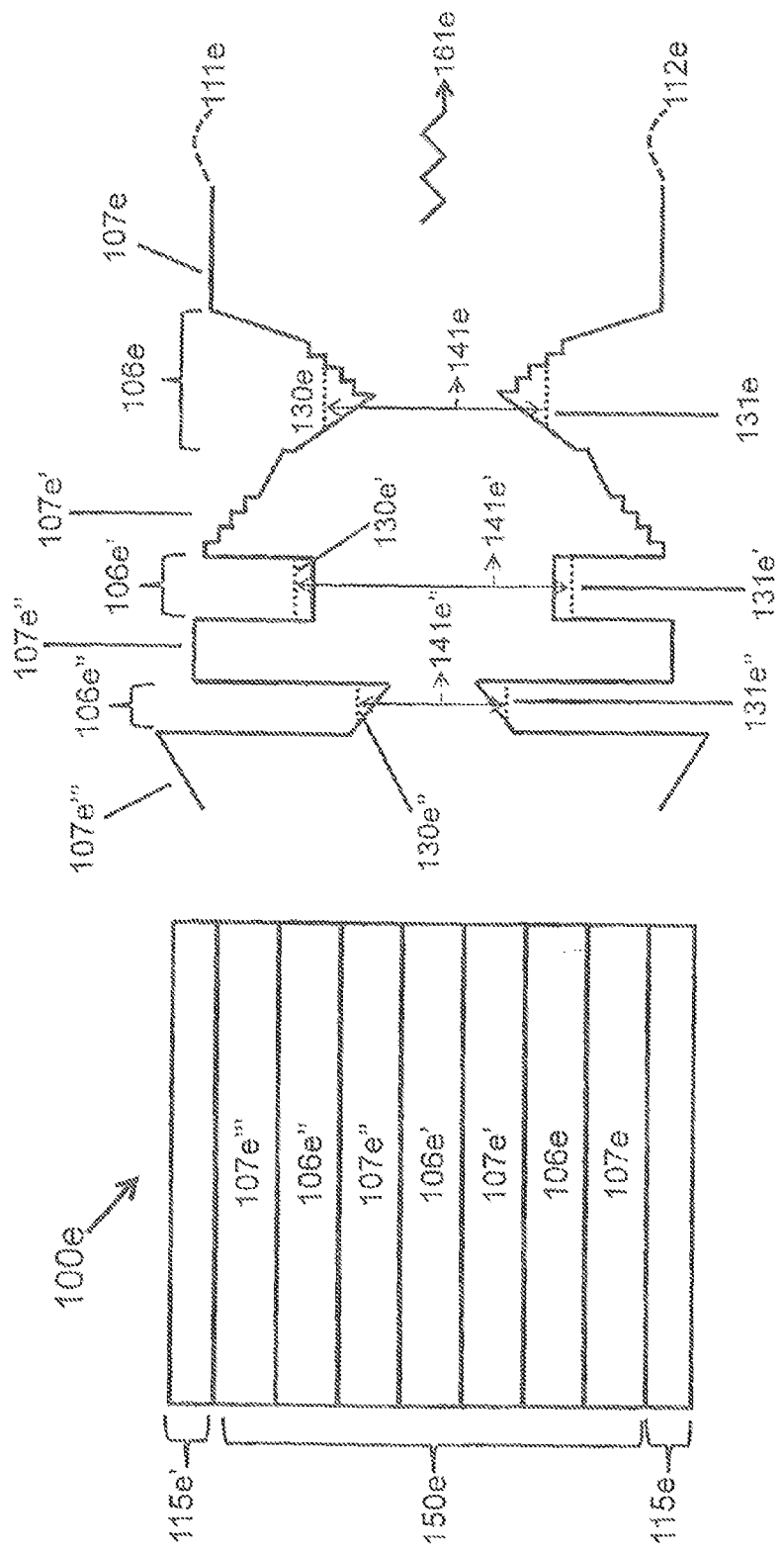

FIG. 2E illustrates an active region 150$e$ of an LED 100$e$ and a corresponding energy band diagram of the active region 150$e$ according to some embodiments of FIG. 1, which includes an indium aluminum gallium nitride (In$_x$Al$_y$Ga$_{1-x-y}$N) based active region 150$e$ formed between an n-type region 115$e$ and a p-type region 115$e'$. In the notation In$_x$Al$_y$Ga$_{1-x-y}$N, 0≤x≤1, 0≤y≤1, and x+y≤1. Herein In$_x$Al$_y$Ga$_{1-x-y}$N or InAlGaN as followed may refer to at least one of AlGaN, InAlGaN, GaN, AN, InAlN, InGaN and InN. The InAlGaN-based active region 150$e$ is a multiple-quantum well structure including a plurality of alternating barrier layers 107$e$, 107$e'$, 107$e''$ and 107$e'''$, and active layers 106$e$, 106$e'$, and 106$e''$. It is understood that the numbers of active and barrier layers are approximate and illustrative, and as such, may be changed in some other embodiments to obtain a desired spectral output. For the InAlGaN-based active region 150$e$, the active layers 106$e$, 106$e'$, and 106$e''$ and barrier layers 107$e$, 107$e'$, 107$e''$ and 107$e'''$ may be respectively configured to comprise different material compositions, material inhomogeneities, strain inhomogeneities, defect states, thicknesses, shapes, and/or doping types and concentrations, from layer to layer or within a specific layer to define a plurality of quantum wells and barriers, and corresponding interband transitions energies which may be defined by the differences between conduction subband energy levels and valence subband energy levels within the quantum wells, i. e., 130$e$ and 131$e$, 130$e'$ and 131$e'$, 130$e''$ and 131$e''$, respectively. It is understood that the conduction subband energy levels 130$e$, 130$e'$ and 130$e''$ and valence subband energy levels 131$e$, 131$e'$ and 131$e''$ in the above examples are approximate and illustrative, and as such, the conduction subbands and valance subbands refer to all the conduction subbands and valence subbands that contribute to the radiative recombination within the active region 150$e$. Accordingly, electrons and holes in the active layers 106$e$, 106$e'$, and 106$e''$ may recombine radiatively and have spectral distributions 141$e$, 141$e'$, and 141$e''$ with wavelengths consistent with the corresponding interband transitions energies, which addictively combine to provide a desired multiple-wavelength and/or broadband UV spectral output 161$e$. In particular, the indium, aluminum and gallium compositions may vary over a thickness of the active layers 106$e$ and 106$e''$ and barrier layers 107$e'$ and 107$e'''$ to provide stepwise and/or continuous grading; the active layers 106$e$, 106$e'$, and 106$e''$ and barrier layers 107$e'$ and 107$e''$ respectively have relatively different thicknesses which may result in varying interband transition energies. Accordingly, the active layers 106$e$, 106$e'$, and 106$e''$ may provide three different single-wavelength spectral distributions 141$e$, 141$e'$, and 141$e''$ based on different interband transition energies, as shown in FIG. 2E. As illustrated in the energy band diagram of FIG. 2E, the energy levels of a conduction band edge 111e and a valence band edge 112e are shown schematically. The energy levels are related with the configurations used to form the active layers 106e, 106e', and 106e'' and the barrier layers 107e, 107e', 107e'' and 107e'''. Additionally, although illustrated in FIG. 2E as having stoichiometries selected to provide medium-to-higher-to-lower bandgap energies and interband transition energies, other stoichiometries may also be used for the active layers 106e, 106e', and 106e'', as discussed in detail above with reference to FIGS. 1 and FIGS. 2A-2E.

Figure 3A:
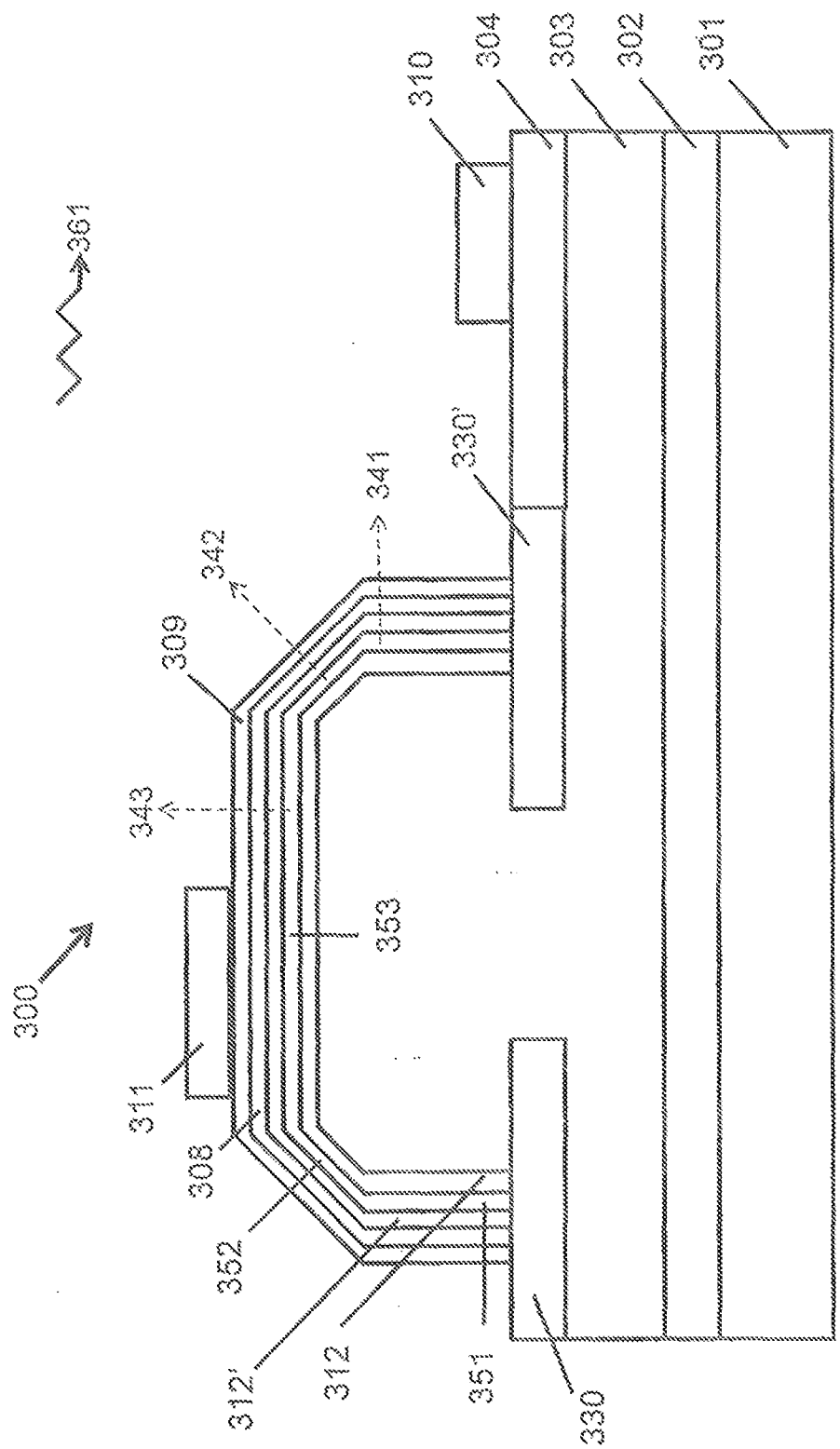
FIGS. 3A and 3B are a cross-sectional view of a UV-LED of the present invention and corresponding drawings illustrating the active regions of the device.
Figure 3B:
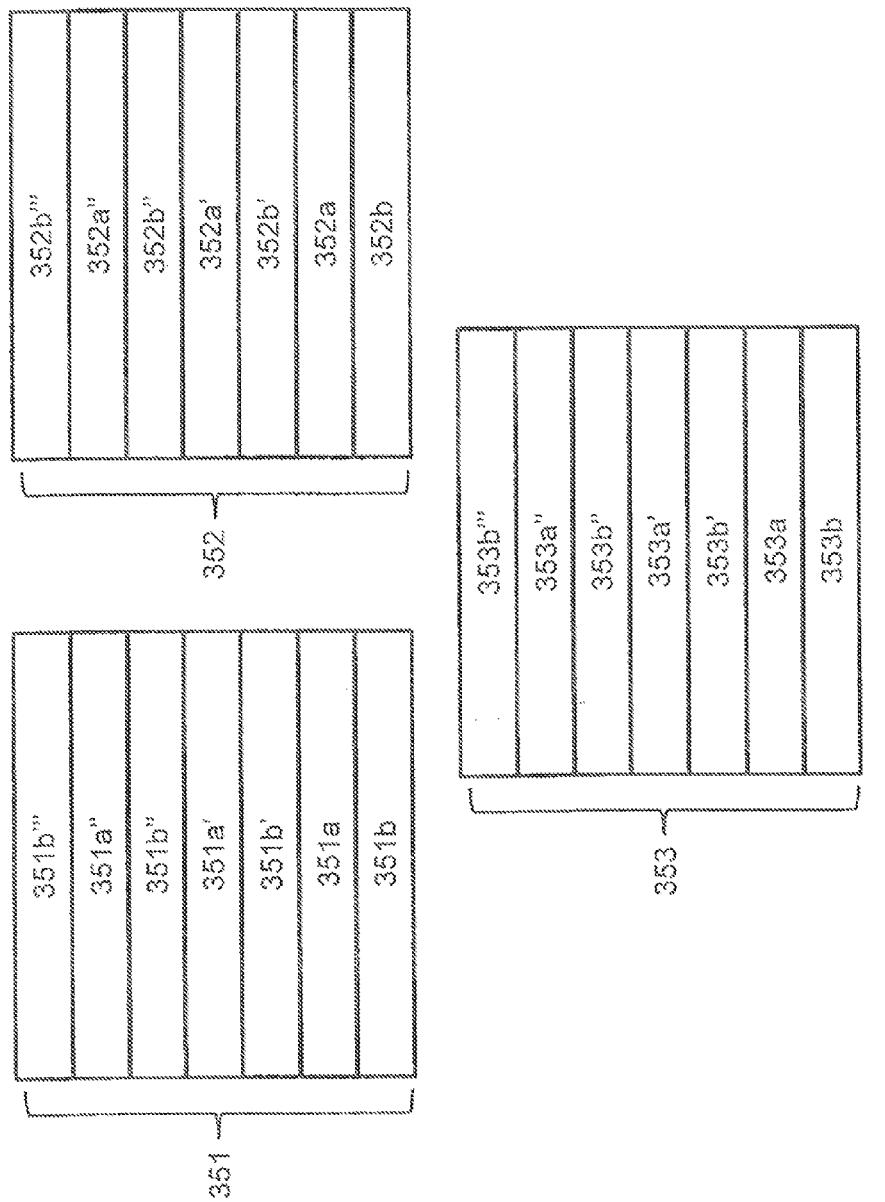

Referring now to the present invention in more detail, in FIGS. 3A and 3B, there is shown a cross-sectional view illustrating a monolithic multiple-wavelength and/or broadband UV-LED 300.

The UV-LED 300 includes three indium aluminum gallium nitride ($In_xAl_yGa_{1-x-y}N$) based active regions 351, 352 and 353 connected in parallel and formed between a n-type region and a p-type region layer. In the notation $In_xAl_yGa_{1-x-y}N$, $0 \le x \le 1$, $0 \le y \le 1$, and $x+y \le 1$. Herein $In_xAl_yGa_{1-x-y}N$ may refer to at least one of AlGaN, InAlGaN, GaN, AN, InAlN, InGaN and InN. Similar to the said embodiments with reference to FIG. 1 and FIGS. 2A-2E, the n-type region may include an n-type contact layer 304, n-cladding layer 303, an n-type confinement layer 312, and/or an n-type capping layer (not shown). The p-type region may include a p-cladding layer 308, a p-type confinement layer 312', and/or a p-type capping layer (not shown). In some embodiments, the indium may be incorporated into at least one of the active layers to take advantage of the indium segregation effects, by which the intensity of a multiple-wavelength and/or broadband spectral output 361 of LED 300 may be less sensitive to the threading dislocation density. In some embodiments, indium may not be incorporated in the active layers and barrier layers, as discussed in details above with reference to FIG. 2A and FIG. 2C. The active regions 351, 352 and 353 may be based on single or multiple quantum well structures formed along various crystal orientations. The various crystal orientations may be formed by selective-area growth, or post-growth etching. It is understood that the number of active regions with different crystal orientations are approximate and illustrative, and as such, may be increased or decreased depending on the spectral output of interest. The active regions 351, 352 and 353 consist of a plurality of alternating active layers and barrier layers 351a, 351a', 351a'', 351b, 351b', 351b'' and 351b''', and 352a, 352a', 352a'', 352b, 352b', 352b'' and 352b''', and 353a, 353a', 353a'', 353b, 353b', 353b'' and 353b''', respectively. It is understood that the number of active layers and barrier layers are approximate and illustrative, and as such, may be increased or decreased in some other embodiments to obtain a desired spectral output. It is also understood that the barrier layers have chosen compositions to provide larger bandgaps than the adjacent active layers in the active regions 351, 352 and 353. In some embodiments, the active regions 351, 352 and 353 may be formed in the same process and condition. In some other embodiments, the active regions 351, 352 and 353 may not be formed in the same process and condition, and may be of different structures. It is also understood that the n-type or p-type confinement layers may not be used, or that a different numbers of the n-type or p-type confinement layers may be used in some other embodiments. Additionally, the n-type contact layer 304 and p-type contact layer 309 may be formed on the n-type cladding layer 303 and p-type cladding layer 308, respectively. The contact layers 304 and 309 may be doped differently from the cladding layers 303 and 308, which may be used for carrier spreading before the carriers transport to the cladding layers 303 and 308, respectively. In some other embodiments, the UV-LED 300 may or may not include one or more n-type capping layers and p-type capping layers (not shown) directly below the n-type contact layer 304 and a p-type contact layer 309, respectively. It is to be understood that the n-type cladding layer 303, p-type cladding layer 308, n-type contact layer 304, p-type contact layer 309, n-type contact 310, p-type contact 311, and p-type capping layer (not shown) which are formed on the active regions 351, 352 and 353, may have various crystal orientations corresponding to those of the active regions 351, 352 and 353. For the sake of simplicity, only one reference number is assigned to any of those non-active region structures or layers despite they have different crystal orientations. In addition, the UV-LED 300 may or may not include a substrate 301, on which a buffer layer 302 may be formed.

Still referring to FIGS. 3A and 3B, the active regions 351, 352 and 353 are of various crystal orientations, for example, [11-20], [11-22] and [0001] orientations, respectively. It is to be understood that by those skilled in the art that, the selective-area regrowth of III-Nitride semiconductor materials on patterned dielectric material masks 330 and 330' may create three-dimensional III-Nitride structures, which, depending on the mask geometry, may consist of different facets such as non-polar (11-20) and (1-100), semi-polar (10-1-3), (10-1-1) and (11-22), and polar (0001). In some embodiments, the dielectric masks may comprise silicon dioxide ($SiO_2$).

Also understood by those skilled in the art, that, the formation of active regions 351, 352 and 353 on various orientations may result in corresponding various compositions and stoichiometries in the active regions 351, 352 and 353, doping profiles, active layer thicknesses, and/or barrier layer thicknesses, which is referred to as crystal orientation effect and may lead to various bandgaps and interband transition energies defined by the difference between conduction subband energy levels and valence subband energy levels in the quantum wells.

In a first embodiment of the device depicted in FIGS. 3A and 3B, a plurality of indium aluminum gallium nitride ($In_xAl_yGa_{1-x-y}N$) single or multiple quantum well active regions 351, 352 and 353 may be formed in the same process with a material growth recipe. In the notation $In_xAl_yGa_{1-x-y}N$, $0 \le x \le 1$, $0 \le y \le 1$, and $x+y \le 1$. Herein $In_xAl_yGa_{1-x-y}N$ may refer to at least one of AlGaN, InAlGaN, GaN, AN, InAlN, InGaN and InN. In the recipe, configurations for the active layer(s) and barrier layers such as material compositions, material inhomogeneities, strain inhomogeneities, defect states, thicknesses, shapes, and doping types and concentrations are fixed from active layer to active layer and from barrier layer to barrier layer to provide ultraviolet emission. Accordingly, supposing all the active regions 351, 352 and 353 are formed by the same condition and on the same crystal orientation, for example, [0001], it is understood that the band diagrams and thus interband transition energies within the active layers between the active regions 351, 352 and 353 are identical. Therefore a multiple-wavelength and/or broadband UV spectral output from the active regions is unlikely. However, still referring to FIGS. 3A and 3B, the active regions 351, 352 and 353 are of various crystal orientations, for example, [11-20], [11-22] and [0001], respectively, by which the configuration for the active layer(s) and the configuration for the barrier layers may be modified due to the crystal orientation effect, for example, variation of the material composition along different orientations. Hence the band diagrams of the active regions 351, 352 and 353 and thus the interband transition energies are modified accordingly. Therefore a desired plurality of spectral outputs 341, 342 and 343 of the active regions 351, 352 and 353 can be emitted with various spectral distributions about the wavelength range 210 nm to 400 nm, which may additively combine to provide a desired multiple-wavelength and/or broadband UV spectral output 361 of the UV-LED 300. Additionally, it is also understood by those skilled in the art, that, the built-in polarizations of indium aluminum gallium nitride material is orientation-dependent, and the polarization fields affect the band diagram of the active regions 351, 352 and 353, which may be used additively with the crystal orientation effect or separately to provide a desired multiple-wavelength and/or broadband UV spectral output 361 of the UV-LED 300.

In a second embodiment of the device depicted in FIGS. 3A and 3B, a plurality of indium aluminum gallium nitride ($In_xAl_yGa_{1-x-y}N$) multiple quantum well active regions 351, 352 and 353 may be formed in the same process with a material growth recipe. In the notation $In_xAl_yGa_{1-x-y}N$, $0 \leq x \leq 1$, $0 \leq y \leq 1$, and $x+y \leq 1$. Herein $In_xAl_yGa_{1-x-y}N$ may refer to at least one of AlGaN, InAlGaN, GaN, AN, InAlN, InGaN and InN. In the recipe, the material compositions, material inhomogeneities, strain inhomogeneities, defect states, thicknesses, shapes, and doping types and concentrations of the active and barrier layers may be respectively configured differently from active layer to active layer and from barrier layer to barrier layer to provide a plurality of different bandgaps and interband transitions energies within each active region. Still referring to FIGS. 3A and 3B, the active regions 351, 352 and 353 are of various crystal orientations, for example, [11-20], [11-22] and [0001], respectively, by which the configuration for the active layers and the configuration for the barrier layers may be modified due to the crystal orientation effect, for example, variation of the material composition along different orientations. Hence the band diagrams of the active regions 351, 352 and 353 and thus the interband transition energies are modified accordingly. Therefore a plurality of spectral outputs 341, 342 and 343 from the active regions 351, 352 and 353 can be emitted with various spectral distributions about the wavelength range 210 nm to 400 nm, which may additively combine to provide a desired multiple-wavelength and/or broadband UV spectral output 361 of the UV-LED 300. It is also understood by those skilled in the art, that, the built-in polarizations of indium aluminum gallium nitride material is orientation-dependent, and the polarizations affect the band diagram of the active regions 351, 352 and 353, which may be used additively with the crystal orientation effect or separately to provide a desired multiple-wavelength and/or broadband UV spectral output 361 of the UV-LED 300.

Figure 4B:
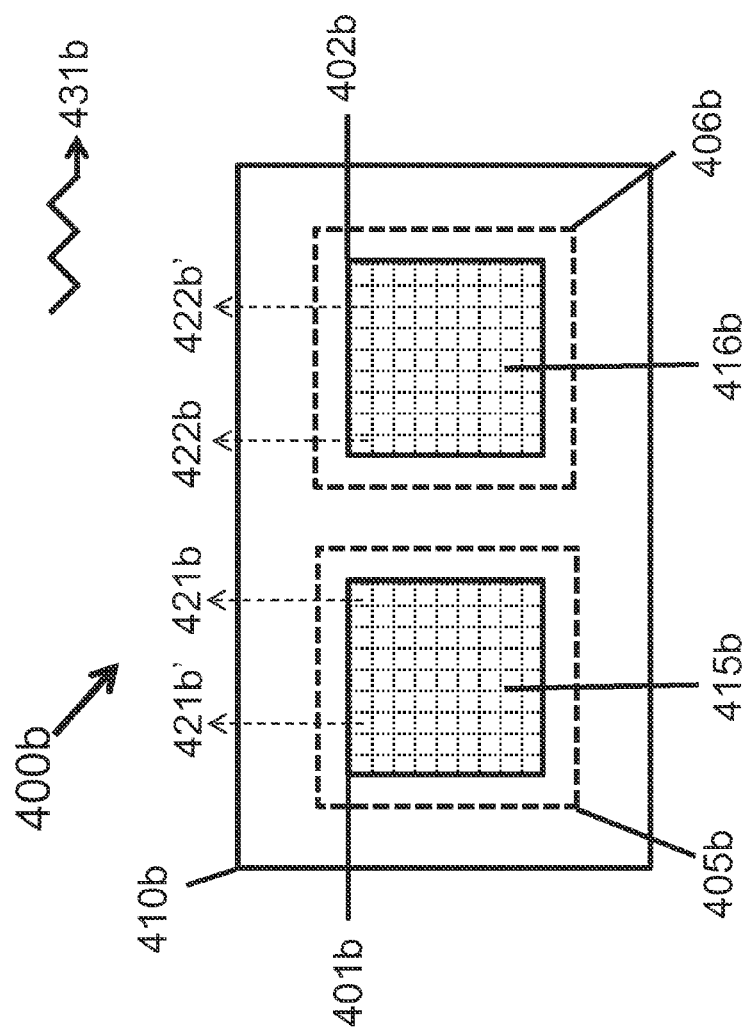
Figure 4C:
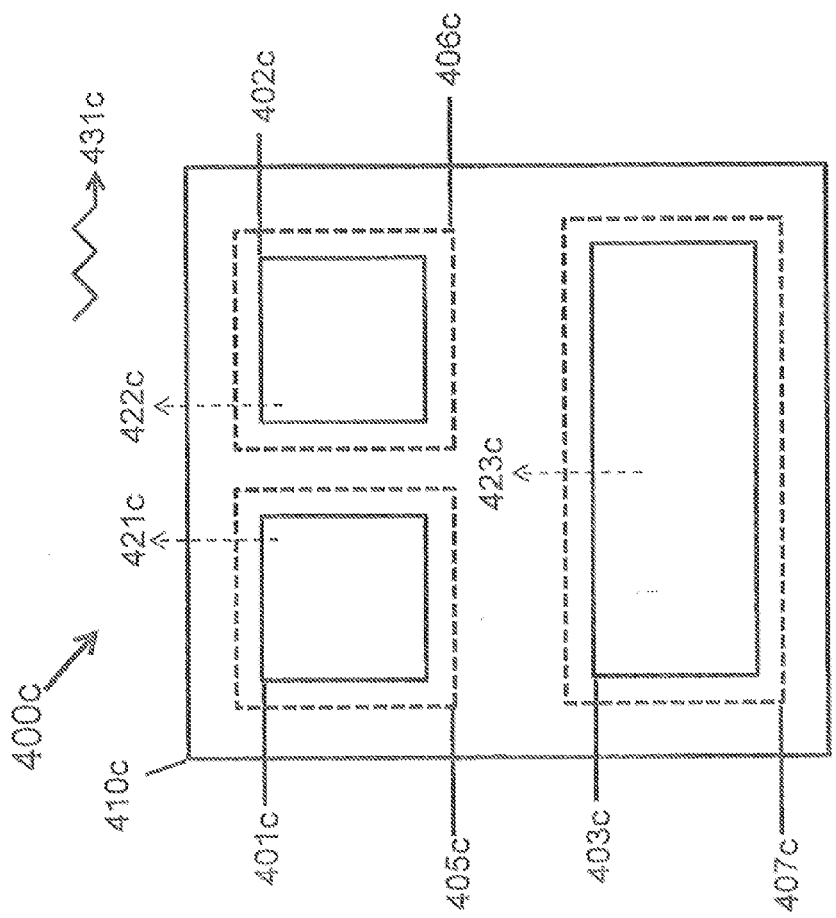

FIGS. 4A-4D illustrate lamps having multiple-wavelength and/or broadband ultraviolet spectral outputs of a wavelength range of 210 nm to 400 nm, according to some embodiments of the present invention which may include a number of monolithic conventional single-wavelength UV-LED chips and/or the as-described UV-LED chips above with reference to FIG. 1, FIGS. 2A-2E and FIGS. 3A and 3B. It is understood that the numbers and sizes of UV-LED chips and die-mounting regions as shown in FIGS. 4A-4C are illustrative, and as such, may be varying.

FIG. 4A illustrates a multiple-chip multiple-wavelength and/or broadband ultraviolet (UV) lamp 400a according to some embodiments of the present invention, which contains a common submount 410a including a first and a second die-mounting regions 405a and 406a. A first and a second UV-LED chips 401a and 402a may be mounted onto the die-mounting regions 405a and 406a, respectively. In some embodiments, two single-wavelength UV-LED chips 401a and 402a emitting light with different spectral distributions 421a and 422a may be used to produce a desired multiple-wavelength and/or broadband UV spectral output 431a from the lamp 400a. In some other embodiments, one single-wavelength UV-LED chip 401a and one multiple-wavelength and/or broadband UV-LED chip 402a emitting light with spectral distributions 421a and 422a may be used to produce a desired multiple-wavelength and/or broadband UV spectral output 431a. In some other embodiments, two multiple-wavelength and/or broadband UV-LED chips emitting light with the same or different spectral distributions 421a and 422a may be used to produce a desired multiple-wavelength and/or broadband UV spectral output 431a. In addition, the lamp 400a may not include a light conversion material such as phosphor-based materials. Therefore the lamp 400a may not involve certain energy loss processes such as absorption and/or remission associated with the light conversion material.

FIG. 4B illustrates a multiple-chip multiple-wavelength and/or broadband ultraviolet (UV) lamp 400b according to some embodiments of the present invention, which contains a submount 410b including a first and a second die-mounting regions 405b and 406b. A first and a second UV-LED chips 401b and 402b may be mounted onto the die-mounting regions 405b and 406b, respectively. A first light conversion material 415b and a second light conversion material 416b, such as phosphor-based materials, may be respectively configured to absorb at least some of the light emitted by the UV-LED chips 401b and 402b and re-emit light of spectral distributions 421b' and 422b', part of which may be within the UV wavelength range of 210 nm to 400 nm. Hence the spectral distributions 421b' and 422b' may combine with the unabsorbed part of spectral distributions 421b and 422b of the chip to form a desired spectral output 431b. It is understood that the number and size of light conversion materials are approximate and illustrative, and as such, may be different than the number shown in FIG. 4B. In some embodiments, two single-wavelength UV-LED chips 401b and 402b may be used. In some other embodiments, at least one multiple-wavelength and/or broadband UV-LED chip may be used. In some embodiments, the light conversion materials 415b or 416b may be configured to absorb at least some of the light emitted by the UV-LED chips 401b or 402b and re-emit light over a wavelength range between the spectral distributions 421b and 422b. Still referring to FIG. 4B, in some embodiments, the light conversion materials 415b and 416b may at least partially coat the UV-LED chips by a number of approaches, for example, coated on the UV-LED chips 401b and 402b. In addition, the light conversion materials 415b and 416b may be contained within an encapsulation material in a transparent shell where the UV-LED chips are placed. In addition, the light conversion materials 415b and 416b may be formed on the LED chips by using conventional techniques, for example, molding, spin coating, screen printing, evaporation and/or electrophoretic deposition. In some other embodiments, the light conversion material 420b and 421b may comprise at least one direct bandgap semiconductor material with the bandgap and corresponding wavelength smaller than at least some wavelengths of the spectral distributions of UV-LED chips 401b and 402b. In some other embodiments, thicknesses and/or compositions of the light conversion materials 415b and 416b may be different.

FIG. 4C illustrates a multiple-chip multiple-wavelength and/or broadband ultraviolet (UV) lamp 400c according to some embodiments of the present invention, which contains a submount 410c including a first, a second and a third die-mounting regions 405c, 406c and 407c. Any of single-wavelength, multiple-wavelength and/or broadband UV-LED chips may be mounted onto the die-mounting regions 405c, 406c, and 407c, respectively. In particular, the lamp 400c may include UV-LED chips 401c, 402c and 403c of different spectral distributions 421c, 422c and 423c, emission patterns, sizes, and/or shapes to provide a desired multiple-wavelength and/or broadband UV spectral output 431c and emission pattern. For example, the first UV-LED chip 401c may emit light in a wider radiation angle than the other chips. The second UV-LED chip 402c may emit light with a different intensity and/or character. The third UV-LED chip 403c may be larger or smaller and/or have a different shape to emit light with a different intensity and/or character. In some embodiments, three single-wavelength UV-LED chips may be used, wherein at least one of the UV-LED chips 401c, 402c and 403c has a different spectral distribution as compared to the others. In some other embodiments, at least one multiple-wavelength and/or broadband UV-LED chip may be used. It is understood that the drawings in FIG. 4C are approximate and illustrative, and as such, the light conversion materials mentioned above may also be used in the embodiments associated with FIG. 4C. In some embodiments, the sizes and/or designs of the UV-LED chips 401c, 402c and 403c may be adjusted to provide for better match with the power source. Alternatively, one of the UV-LED chips 401c, 402c and 403c according to some embodiments of the present invention may be powered by a different power source so that the relative light emitted may be adjusted and/or optimized to achieve a desirably overall spectral output.

Figure 4D:
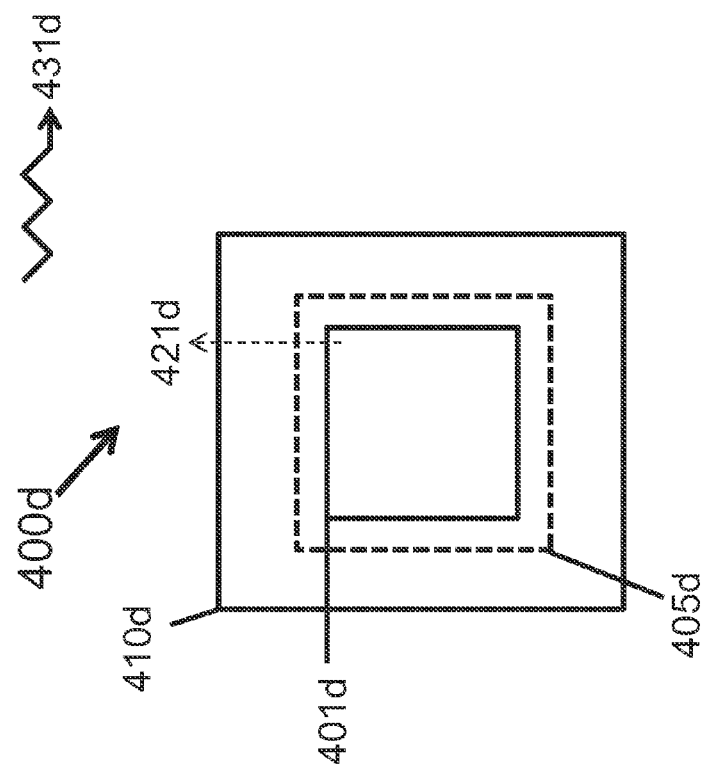

FIG. 4D illustrates a single-chip multiple-wavelength and/or broadband ultraviolet (UV) lamp 400d according to some embodiments of the present invention, which contains a common submount 410d including a die-mounting region 405d. A UV-LED chip 401d may be mounted onto the die-mounting regions 405d. In some embodiments, one multiple-wavelength and/or broadband UV-LED chip 401d emitting light with a spectral distributions 421d may be used to produce a desired multiple-wavelength and/or broadband UV spectral output 431d from the lamp 400d. In some other embodiments, a single-wavelength UV-LED chip 401d with a first spectral distribution 421d and at least one light conversion material (not shown) may be configured to absorb at least some of the light emitted by the chip 401d and re-emit light over a second spectral distribution within the wavelength range of 210 nm to 400 nm to provide a desired multiple-wavelength and/or broadband UV spectral output 431d.

Many modifications and other embodiments of the inventions set forth herein will come to mind to those skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Although specific terms are employed herein, they are used in a generic and descriptive sense only and not for purposes of limitation.

While the foregoing specification teaches the principles of the present invention, with examples provided for the purpose of illustration, it will be appreciated by one skilled in the art from reading this disclosure that various changes in form and detail can be made without departing from the true scope of the invention.

What is claimed is:

1. A monolithic semiconductor light emitting device comprising: an n-type cladding layer; an electrode on the n-type cladding layer; a p-type cladding layer; an electrode on the p-type cladding layer; and an active region of a multiple quantum well structure comprising a plurality of barrier layers and a plurality of active layers alternately laminated, wherein the active region is interposed between the n-type cladding layer and the p-type cladding layer;
wherein the device emits multiple single-wavelength spectral distributions of ultraviolet light each having a peak wavelength of between 210 nm and 400 nm and/or a broadband spectral output having a wavelength of between 210 nm and 400 nm;
wherein a first active layer emits light having a first spectral distribution and having a first peak wavelength within the wavelength range of 210 nm to 400 nm and wherein a second active layer emits light having a second spectral distribution having a second peak wavelength within the wavelength range of 210 nm to 400 nm, wherein the second peak wavelength is different than the first peak wavelength.

2. The monolithic semiconductor light emitting device of claim 1, wherein:
each of the active layers comprises at least one of indium aluminum gallium nitride, indium aluminum nitride, indium gallium nitride, indium nitride, aluminum gallium nitride, gallium nitride, and aluminum nitride; and/or
wherein each of the barrier layers comprises at least one of indium aluminum gallium nitride, indium aluminum nitride, indium gallium nitride, indium nitride, aluminum gallium nitride, gallium nitride, and aluminum nitride.

3. The monolithic semiconductor light emitting device of claim 1, wherein at least one active layer comprises $Al_xGa_{1-x}N$, wherein x is between $0 \le x \le 1$ or wherein $0.43 \le x \le 0.77$ or wherein $0.53 \le x \le 0.85$.

4. The monolithic semiconductor light emitting device of claim 1, wherein the first active layer comprises $Al_xGa_{1-x}N$, wherein $0.74 \le x \le 0.80$, the second active layer comprises $Al_xGa_{1-x}N$, wherein $0.62 \le x \le 0.68$ and a third active layer comprises $Al_xGa_{1-x}N$, wherein $0.29 \le x \le 0.35$.

5. The monolithic semiconductor light emitting device of claim 1, wherein at least one active layer comprises $In_xAl_yGa_{1-x-y}N$, wherein $0 \le x \le 1$, $0 \le y \le 1$ and $x+y \le 1$.

6. The monolithic semiconductor light emitting device of claim 5, wherein $0 \le x \le 0.05$ or wherein $x \le 0.01$ and $0.35 \le y \le 0.99$.

7. The monolithic semiconductor light emitting device of claim 1, further comprising a substrate layer, wherein the n-type region or the p-type region is on the substrate layer.

8. The monolithic semiconductor light emitting device of claim 7, further comprising a buffer layer between the substrate and the n-type region or the p-type region on the substrate layer.

9. The monolithic semiconductor light emitting device of claim 1, further comprising a p-type contact layer between the p-type cladding layer and the electrode on the p-type cladding layer.

10. The monolithic semiconductor light emitting device of claim 1, further comprising an n-type contact layer between the n-type cladding layer and the electrode on the n-type cladding layer.

11. The monolithic semiconductor light emitting device of claim 1, wherein the active region is on a first portion of the n-type cladding layer and wherein the electrode on the n-type cladding layer is on a second portion of the n-type cladding layer spaced from the first portion of the n-type cladding layer and wherein the p-type cladding layer is between the electrode on the p-type cladding layer and the active region.

12. The monolithic semiconductor light emitting device of claim 10, further comprising an n-type confinement layer between the n-type cladding layer and the active region and a p-type confinement layer between the p-type cladding layer and the active region.

13. The monolithic semiconductor light emitting device of claim 1, wherein the device emits multiple single-wavelength spectral distributions output having peak wavelengths in a range between 210 nm and 400 nm.

14. The monolithic semiconductor light emitting device of claim 1, wherein the device emits single-wavelength spectral distributions having peak wavelengths of 225-235 nm, 245-255 nm, and 265-275 nm.

15. The monolithic semiconductor light emitting device of claim 1, wherein the device emits a first single-wavelength spectral distribution at a peak wavelengths of less than 300 nm and a second single-wavelength spectral distribution at a peak wavelengths of 300 nm or greater.

16. A monolithic semiconductor light emitting device comprising:
   a substrate;
   a first semiconductor layer of a first conductivity type on the substrate;
   a raised region of the semiconductor material of the first conductivity type on the first semiconductor layer, the raised region having a plurality of exposed surfaces having different crystal orientations;
   a first barrier layer on the plurality of exposed surfaces of the raised region;
   a first active layer on the first barrier layer, wherein the first active layer comprises a first region having a first crystal orientation and capable of emitting a single-wavelength spectral distribution of ultraviolet light having a first peak wavelength of between 210 nm and 400 nm and a second region having a second crystal orientation different than the first crystal orientation and capable of emitting a single-wavelength spectral distribution of ultraviolet light having a second peak wavelength of between 210 nm and 400 nm, wherein the second peak wavelength is different than the first peak wavelength;
   a second barrier layer on the first active layer; and
   a region of a semiconductor material of a second conductivity type different than the first conductivity type on the second barrier layer.

17. A method of making a monolithic semiconductor light emitting device, the method comprising:
   depositing a first barrier layer on a first semiconductor layer, wherein the first semiconductor layer is on a substrate;
   depositing a first active layer on the first barrier layer;
   depositing a second barrier layer on the first active layer;
   depositing a second active layer on the second barrier layer;
   depositing a third barrier layer on the second active layer;
   depositing a second semiconductor layer on the third barrier layer;
   wherein the first semiconductor layer is p-type and the second semiconductor layer is n-type or wherein the first semiconductor layer is n-type and the second semiconductor layer is p-type; and
   wherein the first active layer emits light having a first spectral distribution and having a first peak wavelength within the wavelength range of 210 nm to 400 nm; and
   wherein the second active layer emits light having a second spectral distribution having a second peak wavelength within the wavelength range of 210 nm to 400 nm, wherein the second peak wavelength is different than the first peak wavelength;
   wherein depositing the first active layer comprises introducing a plurality of precursor gases into a reactor at a first molar ratio and at a first temperature and for a time $t_1$ and wherein the second active layer is made by introducing the precursor gases into the reactor at a second molar ratio, at a second temperature and for a time $t_2$.

18. The method of claim 17:
   wherein the first molar ratio is different than the second molar ratio such that the composition of the first active layer is different than the second active layer; or
   wherein the first temperature is different than the second temperature such that the composition of the first active layer is different than the second active layer; or
   wherein the time $t_1$ is different than the time $t_2$ such that the first active layer has a different thickness than the second active layer.

* * * * *